US011217211B2

(12) United States Patent
Tang et al.

(10) Patent No.: US 11,217,211 B2
(45) Date of Patent: Jan. 4, 2022

(54) MULTIPLE RESOLUTION SECTION DISPLAY PANEL SYSTEMS AND METHODS

(71) Applicant: Apple Inc., Cupertino, CA (US)

(72) Inventors: Yingying Tang, Sunnyvale, CA (US); Chaohao Wang, Sunnyvale, CA (US); Wei H. Yao, Palo Alto, CA (US); Christopher E. Glazowski, Los Gatos, CA (US); Woo Shik Jung, San Jose, CA (US); Scott R. Johnston, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/928,859

(22) Filed: Jul. 14, 2020

(65) Prior Publication Data

US 2021/0027751 A1 Jan. 28, 2021

Related U.S. Application Data

(60) Provisional application No. 62/878,185, filed on Jul. 24, 2019.

(51) Int. Cl.
*G09G 5/391* (2006.01)
*G09G 5/14* (2006.01)

(52) U.S. Cl.
CPC ............... *G09G 5/391* (2013.01); *G09G 5/14* (2013.01); *G09G 2340/0407* (2013.01); *G09G 2360/144* (2013.01)

(58) Field of Classification Search
CPC .. G09G 5/391; G09G 5/14; G09G 2340/0407; G09G 2360/144;

(Continued)

(56) References Cited

U.S. PATENT DOCUMENTS

2017/0076654 A1* 3/2017 Wang ................... G09G 3/2074
2019/0326366 A1 10/2019 Fan et al.
(Continued)

FOREIGN PATENT DOCUMENTS

WO 2019/062221 A1 4/2019

OTHER PUBLICATIONS

Invitation to Pay and Partial International Search Report for PCT Application No. PCT/US2020/043123 dated Oct. 30, 2020; 22 pgs.

*Primary Examiner* — Xilin Guo
(74) *Attorney, Agent, or Firm* — Fletcher Yoder, P.C.

(57) ABSTRACT

Techniques for implementing and/or operating an electronic device that includes a display panel, which displays an image and includes a first panel section implemented with a lower pixel resolution and a second panel section implemented with a higher pixel resolution, an optical sensor disposed behind the first panel section of the display panel, and image processing circuitry communicatively coupled to the display panel. The image processing circuitry receives source image data corresponding with the image, in which the source image data is indicative of target luminance of a display pixel, determines a pixel resolution surrounding the display pixel, processes the source image based at least in part on the pixel resolution surrounding the display pixel to facilitate determining display image data corresponding with the display pixel, and outputs the display image data to enable the display panel to display the image based on the display image data.

25 Claims, 14 Drawing Sheets

(58) Field of Classification Search
CPC .. G09G 3/3607; G09G 3/3666; G09G 3/3208; G09G 2300/0452; G09G 2320/0271; G09G 2340/0414; G09G 2340/0421; G09G 2320/0233; G09G 2300/0426; G09G 3/3233; G09G 2310/0251; G09G 2340/0457; G09G 3/3426; H01L 27/326
See application file for complete search history.

(56) References Cited

U.S. PATENT DOCUMENTS

2020/0265779 A1\* 8/2020 In ........................ G09G 3/3225
2021/0065625 A1\* 3/2021 Wang .................. G09G 3/3266

\* cited by examiner

MULTIPLE RESOLUTION SECTION DISPLAY PANEL SYSTEMS AND METHODS

CROSS-REFERENCE TO RELATED APPLICATIONS

This application claims priority to and the benefit of U.S. Provisional Application No. 62/878,185, filed Jul. 24, 2019, and entitled, "MULTIPLE RESOLUTION SECTION DISPLAY PANEL SYSTEMS AND METHODS," which is incorporated herein by reference in its entirety for all purposes.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to electronic displays, which may be used to present visual representations of information as one or more images (e.g., image frames and/or pictures). Accordingly, electronic devices, such as computers, mobile phones, portable media devices, tablets, televisions, virtual-reality headsets, and vehicle dashboards, among many others, often include and/or utilize one or more electronic displays. To display one or more images, a display panel of an electronic display generally includes display pixels and driver circuitry coupled to the display pixels. In particular, the driver circuitry may include a scan driver, which is coupled to display pixel rows via corresponding scan lines, and a data driver, which is coupled to display pixel columns via corresponding data lines, thereby enabling the display panel to display an image by controlling light emission from its display pixels.

Generally, light emission from a display pixel varies with the amount of electrical energy stored therein. For example, in some instances, a display pixel may include a light emissive element, such as an organic light-emitting diode (OLED), that varies its light emission with current flow therethrough, a current control switching device (e.g., transistor) coupled between the light emissive element and a pixel power (e.g., VDD) supply rail, and a storage capacitor coupled to a control (e.g., gate) terminal of the current control switching device. As such, varying the amount of energy stored in the storage capacitor may vary voltage applied to the control terminal of the current control switching device and, thus, magnitude of electrical current supplied from the pixel power supply rail to the light emissive element of the display pixel.

However, it should be appreciated that discussion with regard to OLED display pixels, OLED display panels, and OLED electronic displays is merely intended to be illustrative and not limiting. In other words, the techniques described in the present disclosure may be applied to and/or adapted for other types of electronic displays, such as liquid crystal display (LCD) electronic displays and/or micro light-emitting diode (LED) electronic displays. In any case, since light emission from a display pixel generally varies with electrical energy storage therein, to display an image, a display panel may write a display pixel at least in part by supplying an analog electrical (e.g., voltage and/or current) signal to the display pixel, for example, to charge and/or discharge a storage capacitor implemented in the display pixel.

Since used to display images that provide visual representations of information, a display panel is often implemented (e.g., disposed) along one or more external surfaces of an electronic device. For example, the display panel may be implemented along a front-facing surface and/or a back-facing surface of the electronic device. Additionally or alternatively, the display panel may be implemented along one or more side surface of the electronic device, such as a top-facing surface, a bottom-facing surface, a left-facing surface, a right-facing surface, or any combination thereof.

In addition to an electronic display, an electronic device often includes one or more optical (e.g., light) sensors. For example, the electronic device may include an ambient light sensor that is implemented and/or operated to sense (e.g., measure) environmental lighting conditions. Additionally or alternatively, the electronic device may include an image sensor, such as a camera, that is implemented and/or operated to capture an image at least in part by generating (e.g., outputting) image data, which provides a digital representation of the image, based at least in part on sensed light. In particular, the image sensor may capture an image by generating image data that indicates color and/or luminance of light sensed at various points (e.g., image pixels) in the image.

Since used to sense light, one or more optical sensors are often implemented (e.g., disposed) along an external surface of an electronic device. In fact, in some instances, an optical sensor and a display panel may be implemented along the same external surface of an electronic device. Merely as an illustrative non limiting example, the optical sensor and the display panel may both be implemented along a front-facing surface of the electronic device. However, real estate (e.g., space) in an electronic device—particularly along an external surface of the electronic device—is often limited, for example, to facilitate reducing physical size (e.g., physical footprint) and, thus, improving portability of the electronic device.

Accordingly, to facilitate optimizing (e.g., maximizing) available real estate, the present disclosure describes techniques for implementing and/or operating an electronic device that includes a display panel and one or more optical sensors implemented (e.g., disposed) along the same portion of a device (e.g., external) surface. In particular, in some embodiments, one or more optical sensors may be disposed behind the display panel. In other words, in such embodiments, the one or more optical sensors may sense (e.g., measure) light that passes through an external surface of the electronic device as well as light transmissive (e.g., transparent) material implemented in the display panel.

However, at least in some instances, a display panel may also include opaque (e.g., non-light transmissive) material, for example, which is used to implement switching devices (e.g., transistors) in it display pixels, storage capacitors in its display pixels, data lines coupled to its display pixels, and/or scan lines coupled to its display pixels. In other words, at least in some instances, opaque material implemented in a display panel may block light that passes through the external surface of the electronic device from reaching an optical sensor disposed behind the display panel. In fact, at least in some instances, the amount of opaque material that blocks light from reaching an optical sensor may depend at least in part on the number of display pixels implemented in front of (e.g., overlapping with) the optical sensor.

As such, to facilitate improving the ability of an optical sensor implemented behind a display panel to accurately sense light that passes through the external surface of the electronic device, at least a portion of the display panel may be implemented with fewer display pixels and, thus, a lower pixel resolution (e.g., display pixels per square inch). However, at least in some instances, perceived quality of an image displayed on a display panel may vary with pixel resolution. For example, compared to a higher pixel resolution, a lower pixel resolution may reduce the ability of a display panel to depict details of an image.

Thus, to facilitate improving perceived image quality provided by a display panel while enabling one or more optical sensors to be disposed behind the display panel, in some embodiments, a display panel may be implemented with multiple panel sections that each has a different pixel resolution. For example, a display panel may include a first panel section implemented with a lower pixel resolution and a second panel section implemented with a higher pixel resolution. In other words, the display panel may include a high (e.g., higher and/or full) resolution panel section and a low (e.g., lower and/or downsampled) resolution panel section behind which one or more optical sensors may be implemented (e.g., disposed). Merely as an illustrative non-limiting example, the low resolution panel section may be implemented with half the pixel resolution of the high resolution panel section.

As will be described in more detail below, at least in some instances, the same pixel resolution may be implemented using multiple different pixel layouts, which each indicates location and/or color component of display pixels on a display panel. In fact, in some embodiments, the pixel layout of a lower resolution panel section may be determined based at least in part on the pixel layout of a corresponding high resolution panel section. In particular, in some embodiments, the pixel layout of the lower resolution panel section may be determined by adapting the pixel layout of the corresponding high resolution panel section to achieve a target pixel resolution of the lower resolution panel section. Merely as an illustrative non-limiting example, to implement a pixel resolution that is half the pixel resolution of the high resolution panel section, the pixel layout of the lower resolution panel section may be determined by adapting the pixel layout of the high resolution panel section to remove every other line of display pixels.

In some embodiments, a line of display pixels may correspond with a display pixel row, which includes each of the display pixels coupled to a corresponding (e.g., single) scan line. However, it should be noted that, as used in the present disclosure, a "line of display pixels" does not necessarily correspond with a "display pixel row." In particular, in some embodiments, a line of display pixels may include display pixels implemented in multiple different display pixel rows. For example, a line of display pixels may include one or more display pixels implemented in a first display pixel row as well as one or more display pixels implemented in a second display pixel row adjacent the first display pixel row. Additionally or alternatively, a line of display pixels may include the display pixels implemented in one or more display pixel columns, which includes each of the display pixels coupled to a corresponding (e.g., single) data line.

In some embodiments, each display pixel on a display panel may be implemented and/or operated to control light emission and, thus, perceived luminance of a specific color component. For example, the display panel may include one or more red sub-pixels, one or more blue sub-pixels, one or more green sub-pixels, or any combination thereof. Additionally or alternatively, the display panel may include one or more white sub-pixels. In other words, as used herein, a "display pixel" may be a color component sub-pixel, such as a red sub-pixel, a blue sub-pixel, a green sub-pixel, or a white sub-pixel.

Furthermore, in some embodiments, multiple color component sub-pixels implemented on a display panel may be grouped together as a display pixel unit. For example, the display panel may include multiple display pixel units, which each includes a blue sub-pixel, a red sub-pixel, and a green sub-pixel. Additionally or alternatively, the display panel may include a first set of display pixel units, which each includes a blue sub-pixel and a green sub-pixel, and a second set of display pixel units, which each includes a red sub-pixel and a green sub-pixel. In other words, to facilitate displaying an image, a display panel may control perceived color and/or perceived luminance of a display pixel unit by controlling light emission from each of its color component sub-pixels.

As described above, an image sensor, such as a camera, may be implemented and/or operated to capture an image at least in part by generating (e.g., outputting) image data, which provides a digital representation of the image. In particular, image data corresponding with an image may be indicative of target luminance of one or more color components at various points (e.g., image pixels) in the image. In other words, an image pixel may correspond with a display pixel unit implemented on a display panel and, thus, corresponding image data may include color component image data that indicates target luminance of each color component sub-pixel (e.g., display pixel) in the display pixel unit. For example, image data corresponding with an image pixel may include red image data indicative of target red sub-pixel perceived luminance, blue image data indicative of target blue sub-pixel perceived luminance, and/or green image data indicative of target green sub-pixel perceived luminance.

As described above, a pixel layout of a lower resolution panel section on a display panel may be determined to achieve a target pixel resolution, for example, by adapting the pixel layout of a corresponding high resolution panel section. However, even providing the same pixel resolution, at least some instances, perceived image quality and/or light transmissiveness provided by different pixel layouts may nevertheless differ. As such, in some embodiments, a design device may be implemented and/or operated to determine (e.g., consider) multiple candidate pixel layouts that each provides a target pixel resolution of a lower resolution panel section. Additionally, the design device may determine perceived image quality and/or light transmissiveness expected to result from each of the candidate pixel layouts as well as a target perceived image quality and/or a target light transmissiveness to be provided by the lower resolution panel section. Based at least in part on comparisons between the target perceived image quality and an expected perceived image quality associated with each of the candidate pixel layouts and/or comparisons between the target light transmissiveness and an expected light transmissiveness associated with each of the candidate pixel layouts, the design device may then select a target pixel layout to be used to implement the lower resolution panel section.

Nevertheless, at least in some instances, perceived luminance of an area (e.g., portion) of a display panel may depend at least in part on pixel resolution implemented therein. For example, when each display pixel emits the same amount of light, perceived luminance of an area in a lower resolution panel section of the display panel may appear darker than perceived luminance of a same-sized area in a higher resolution panel section. As described above, image data corresponding with a display pixel (e.g., color component sub-pixel) implemented on a display panel may be indicative of its target luminance, for example, by indicating a target grayscale value (e.g., level) that is scaled (e.g., non-linearly) to a panel brightness setting.

To facilitate compensating for variations in perceived luminance resulting from differing pixel resolutions, in some embodiments, an electronic device may include image processing circuitry implemented and/or operated to process image data before the image data is supplied to a display panel to display a corresponding image. In particular, in some embodiments, the image processing circuitry may receive (e.g., from memory) source image data output from an image source, such as an image sensor (e.g., camera) and/or a processor (e.g., CPU and/or GPU) implemented in the electronic device. Based at least in part on pixel resolution surrounding a display pixel, the image processing circuitry may process corresponding source image data to determine (e.g., generate) display image data, which may then be supplied to the display panel to display a corresponding image.

To facilitate determining display image data that compensates for pixel resolution, in some embodiments, image processing circuitry may include a resolution compensation block (e.g., circuitry group) implemented and/or operated to determine one or more resolution compensation factors to be applied to input image data, such as source image data and/or image data output from upstream image processing circuitry, based at least in part on pixel resolution implemented in an area of the display panel that includes (e.g., surrounds) a corresponding display pixel. For example, the resolution compensation factors may include one or more offset values, which, when applied, bias (e.g., offset) the input image data. Additionally or alternatively, the resolution compensation factors may include one or more gain values, which, when applied, scale the image data.

To facilitate compensating for a lower pixel resolution, in some embodiments, a design device may calibrate the value of one or more resolution compensation factors to be applied to image data such that perceived luminance of an area in a lower resolution panel section generally matches perceived luminance in a same-sized area of a corresponding high resolution panel section. For example, in some embodiments, a gain resolution compensation factor to be applied to image data corresponding with a high (e.g., higher) resolution panel section may be a unity gain value whereas a gain resolution compensation factor to be applied to image data corresponding with a low (e.g., lower) resolution panel section may be greater than the unity gain value. As such, by applying one or more resolution compensation factors, the image processing circuitry (e.g., spatial transition block) may boost image data corresponding with the low resolution panel section relative to image data corresponding with the high resolution panel section to facilitate compensating for reduced light emission that may otherwise result from the lower pixel resolution and, thus, at least in some instances, may facilitate improving perceived image quality provided by the low resolution panel section.

However, at least in some instances, a sudden change in pixel resolution may nevertheless be perceivable and, thus, potentially affect perceived image quality provided by a display panel. In other words, at least in some instances, a transition (e.g., boundary) between a low resolution panel section and a high resolution panel section may be perceivable due to their differing pixel resolutions. To facilitate reducing perceivability of such a transition, in some embodiments, a display panel may include a resolution transition panel section implemented between its low resolution panel section and its high resolution panel section. In particular, in some embodiments, the resolution transition panel section may be implemented to gradually transition between a pixel resolution of the high resolution panel section and a pixel resolution of the low resolution panel section. In other words, in such embodiments, the resolution transition panel section may be implemented with a pixel resolution greater (e.g., higher) than the low resolution panel section and less (e.g., lower) than the high resolution panel section.

Additionally or alternatively, to facilitate reducing perceivability of a boundary between a high resolution panel section and an adjacent lower resolution (e.g., lower resolution transition) panel section of a display panel, in some embodiments, a portion of the high resolution panel section may be operated as a digital transition sub-section, for example, while a remaining portion of the high resolution panel section is operated as a full resolution sub-section. To facilitate operating a portion of the high resolution panel section as a digital transition sub-section, in some embodiments, image processing circuitry may apply different resolution compensation factors to image data corresponding with the digital transition sub-section compared to the resolution compensation factors applied to image data corresponding with a full resolution sub-section (e.g., remainder) of the high resolution panel section. For example, in some embodiments, a unity gain resolution compensation factor may be applied to image data corresponding with the full resolution sub-section in the high resolution panel section and a gain resolution compensation factor greater than the unity gain may be applied to image data corresponding with a low resolution panel section of the display panel. Thus, to facilitate reducing perceivability of a boundary between the high resolution panel section and the low resolution panel section, a gain resolution compensation factor to be applied to a line of display pixels in the digital transition sub-section, which is adjacent to the full resolution sub-section, may be greater than a unity gain. Additionally, moving from the full resolution sub-section toward the low resolution panel section, in some embodiments, the gain resolution compensation factors to be applied to image data corresponding with every other line of display pixels in the digital transition section may gradually increase.

Furthermore, as described above, in some embodiments, a pixel layout of a lower resolution panel section may be determined by removing one or more display pixels from a pixel layout of a corresponding high resolution panel section. Accordingly, at least in some embodiments, image data may correspond with a pixel location (e.g., position) in the low resolution panel section at which a display pixel is not actually implemented. In other words, effectively, a gain value of zero is being applied to image data corresponding with a removed display pixel, for example, after sub-sampling to account for pixel layout.

Thus, to facilitate reducing perceivability of a transition between a low resolution panel section and a high resolution panel section, in some embodiments, a gain resolution compensation factor to be applied to a line of display pixels in a digital transition sub-section of the high resolution panel section, which is adjacent to the low resolution panel section, may be between a zero gain value and a unity gain value. Additionally, moving from the low resolution panel section toward a full resolution sub-section of the high resolution panel section, in some embodiments, the gain resolution compensation factors to be applied to image data corresponding with every other line of display pixels in the digital transition section may gradually increase. In other words, to facilitate operating a portion of a high resolution panel section as a digital transition sub-section, moving from a full resolution sub-section of the high resolution panel section toward the low resolution panel section, in some such embodiments, gain resolution compensation factors may gradually decrease over the course of a first (e.g., even numbered) set of lines and gradually increase over the course of a second (e.g., odd numbered) set of lines.

In this manner, as will be described in more detail below, the techniques described in the present disclosure may facilitate reducing the perceivability of changes between multiple different pixel resolutions implemented on a display panel of an electronic display, which, at least in some instances, may facilitate improving perceived quality of an image being displayed on the display panel and, thus, potentially an electronic device in which the electronic display is deployed. By implementing multiple different pixel resolutions on a display panel, as will be described in more detail below, the techniques described in the present disclosure may facilitate balancing (e.g., optimizing and/or maximizing) perceived image quality provided by the display panel and real estate utilization in an electronic device that includes the display panel, for example, by including a higher (e.g., high) resolution panel section and a lower (e.g., low) resolution panel section behind which one or more optical (e.g., light) sensors may be deployed. Moreover, as will be described in more detail below, the techniques described in the present disclosure may facilitate compensating for perceivable luminance variations resulting from the pixel resolution of a lower resolution panel section of a display panel in an electronic display, which, at least in some instances, may facilitate improving perceived quality of an image being displayed on the display panel and, thus, potentially an electronic device in which the electronic display is deployed.

BRIEF DESCRIPTION OF THE DRAWINGS

Various aspects of the present disclosure may be better understood upon reading the following detailed description and upon reference to the drawings in which.

DETAILED DESCRIPTION

Figure 1:
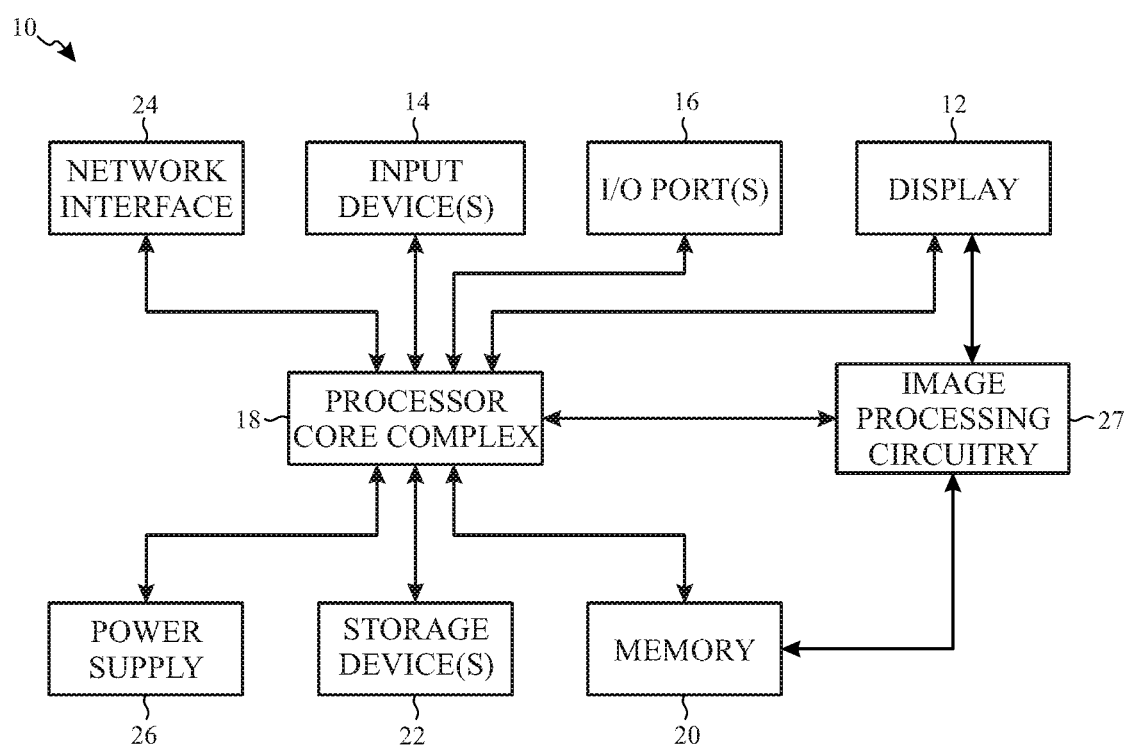
FIG. 1 is a block diagram of an electronic device including an electronic display, in accordance with an embodiment of the present disclosure.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment"

or "an embodiment" of the present disclosure are not intended to be interpreted as excluding the existence of additional embodiments that also incorporate the recited features.

The present disclosure generally relates to electronic displays, which may be used to present visual representations of information as one or more images (e.g., image frames and/or pictures). Accordingly, electronic devices, such as computers, mobile phones, portable media devices, tablets, televisions, virtual-reality headsets, and vehicle dashboards, among many others, often include and/or utilize one or more electronic displays. To display one or more images, a display panel of an electronic display generally includes display pixels and driver circuitry coupled to the display pixels. In particular, the driver circuitry may include a scan driver, which is coupled to display pixel rows via corresponding scan lines, and a data driver, which is coupled to display pixel columns via corresponding data lines, thereby enabling the display panel to display an image by controlling light emission from its display pixels.

Generally, light emission from a display pixel varies with the amount of electrical energy stored therein. For example, in some instances, a display pixel may include a light emissive element, such as an organic light-emitting diode (OLED), that varies its light emission with current flow therethrough, a current control switching device (e.g., transistor) coupled between the light emissive element and a pixel power (e.g., VDD) supply rail, and a storage capacitor coupled to a control (e.g., gate) terminal of the current control switching device. As such, varying the amount of energy stored in the storage capacitor may vary voltage applied to the control terminal of the current control switching device and, thus, magnitude of electrical current supplied from the pixel power supply rail to the light emissive element of the display pixel.

However, it should be appreciated that discussion with regard to OLED display pixels, OLED display panels, and OLED electronic displays is merely intended to be illustrative and not limiting. In other words, the techniques described in the present disclosure may be applied to and/or adapted for other types of electronic displays, such as liquid crystal display (LCD) electronic displays and/or micro light-emitting diode (LED) electronic displays. In any case, since light emission from a display pixel generally varies with electrical energy storage therein, to display an image, a display panel may write a display pixel at least in part by supplying an analog electrical (e.g., voltage and/or current) signal to the display pixel, for example, to charge and/or discharge a storage capacitor implemented in the display pixel.

Since used to display images that provide visual representations of information, a display panel is often implemented (e.g., disposed) along one or more external surfaces of an electronic device. For example, the display panel may be implemented along a front-facing surface and/or a back-facing surface of the electronic device. Additionally or alternatively, the display panel may be implemented along one or more side surface of the electronic device, such as a top-facing surface, a bottom-facing surface, a left-facing surface, a right-facing surface, or any combination thereof.

In addition to an electronic display, an electronic device often includes one or more optical (e.g., light) sensors. For example, the electronic device may include an ambient light sensor that is implemented and/or operated to sense (e.g., measure) environmental lighting conditions. Additionally or alternatively, the electronic device may include an image sensor, such as a camera, that is implemented and/or operated to capture an image at least in part by generating (e.g., outputting) image data, which provides a digital representation of the image, based at least in part on sensed light. In particular, the image sensor may capture an image by generating image data that indicates color and/or luminance of light sensed at various points (e.g., image pixels) in the image.

Since used to sense light, one or more optical sensors are often implemented (e.g., disposed) along an external surface of an electronic device. In fact, in some instances, an optical sensor and a display panel may be implemented along the same external surface of an electronic device. Merely as an illustrative non limiting example, the optical sensor and the display panel may both be implemented along a front-facing surface of the electronic device. However, real estate (e.g., space) in an electronic device—particularly along an external surface of the electronic device—is often limited, for example, to facilitate reducing physical size (e.g., physical footprint) and, thus, improving portability of the electronic device.

Accordingly, to facilitate optimizing (e.g., maximizing) available real estate, the present disclosure describes techniques for implementing and/or operating an electronic device that includes a display panel and one or more optical sensors implemented (e.g., disposed) along the same portion of a device (e.g., external) surface. In particular, in some embodiments, one or more optical sensors may be disposed behind the display panel. In other words, in such embodiments, the one or more optical sensors may sense (e.g., measure) light that passes through an external surface of the electronic device as well as light transmissive (e.g., transparent) material implemented in the display panel.

However, at least in some instances, a display panel may also include opaque (e.g., non-light transmissive) material, for example, which is used to implement switching devices (e.g., transistors) in it display pixels, storage capacitors in its display pixels, data lines coupled to its display pixels, and/or scan lines coupled to its display pixels. In other words, at least in some instances, opaque material implemented in a display panel may block light that passes through the external surface of the electronic device from reaching an optical sensor disposed behind the display panel. In fact, at least in some instances, the amount of opaque material that blocks light from reaching an optical sensor may depend at least in part on the number of display pixels implemented in front of (e.g., overlapping with) the optical sensor.

As such, to facilitate improving the ability of an optical sensor implemented behind a display panel to accurately sense light that passes through the external surface of the electronic device, at least a portion of the display panel may be implemented with fewer display pixels and, thus, a lower pixel resolution (e.g., display pixels per square inch). However, at least in some instances, perceived quality of an image displayed on a display panel may vary with pixel resolution. For example, compared to a higher pixel resolution, a lower pixel resolution may reduce the ability of a display panel to depict details of an image.

Thus, to facilitate improving perceived image quality provided by a display panel while enabling one or more optical sensors to be disposed behind the display panel, in some embodiments, a display panel may be implemented with multiple panel sections that each has a different pixel resolution. For example, a display panel may include a first panel section implemented with a lower pixel resolution and a second panel section implemented with a higher pixel resolution. In other words, the display panel may include a high (e.g., higher and/or full) resolution panel section and a low (e.g., lower and/or downsampled) resolution panel section behind which one or more optical sensors may be implemented (e.g., disposed). Merely as an illustrative non-limiting example, the low resolution panel section may be implemented with half the pixel resolution of the high resolution panel section.

As will be described in more detail below, at least in some instances, the same pixel resolution may be implemented using multiple different pixel layouts, which each indicates location and/or color component of display pixels on a display panel. In fact, in some embodiments, the pixel layout of a lower resolution panel section may be determined based at least in part on the pixel layout of a corresponding high resolution panel section. In particular, in some embodiments, the pixel layout of the lower resolution panel section may be determined by adapting the pixel layout of the corresponding high resolution panel section to achieve a target pixel resolution of the lower resolution panel section. Merely as an illustrative non-limiting example, to implement a pixel resolution that is half the pixel resolution of the high resolution panel section, the pixel layout of the lower resolution panel section may be determined by adapting the pixel layout of the high resolution panel section to remove every other line of display pixels.

In some embodiments, a line of display pixels may correspond with a display pixel row, which includes each of the display pixels coupled to a corresponding (e.g., single) scan line. However, it should be noted that, as used in the present disclosure, a "line of display pixels" does not necessarily correspond with a "display pixel row." In particular, in some embodiments, a line of display pixels may include display pixels implemented in multiple different display pixel rows. For example, a line of display pixels may include one or more display pixels implemented in a first display pixel row as well as one or more display pixels implemented in a second display pixel row adjacent the first display pixel row. Additionally or alternatively, a line of display pixels may include the display pixels implemented in one or more display pixel columns, which includes each of the display pixels coupled to a corresponding (e.g., single) data line.

In some embodiments, each display pixel on a display panel may be implemented and/or operated to control light emission and, thus, perceived luminance of a specific color component. For example, the display panel may include one or more red sub-pixels, one or more blue sub-pixels, one or more green sub-pixels, or any combination thereof. Additionally or alternatively, the display panel may include one or more white sub-pixels. In other words, as used herein, a "display pixel" may be a color component sub-pixel, such as a red sub-pixel, a blue sub-pixel, a green sub-pixel, or a white sub-pixel.

Furthermore, in some embodiments, multiple color component sub-pixels implemented on a display panel may be grouped together as a display pixel unit. For example, the display panel may include multiple display pixel units, which each includes a blue sub-pixel, a red sub-pixel, and a green sub-pixel. Additionally or alternatively, the display panel may include a first set of display pixel units, which each includes a blue sub-pixel and a green sub-pixel, and a second set of display pixel units, which each includes a red sub-pixel and a green sub-pixel. In other words, to facilitate displaying an image, a display panel may control perceived color and/or perceived luminance of a display pixel unit by controlling light emission from each of its color component sub-pixels.

As described above, an image sensor, such as a camera, may be implemented and/or operated to capture an image at least in part by generating (e.g., outputting) image data, which provides a digital representation of the image. In particular, image data corresponding with an image may be indicative of target luminance of one or more color components at various points (e.g., image pixels) in the image. In other words, an image pixel may correspond with a display pixel unit implemented on a display panel and, thus, corresponding image data may include color component image data that indicates target luminance of each color component sub-pixel (e.g., display pixel) in the display pixel unit. For example, image data corresponding with an image pixel may include red image data indicative of target red sub-pixel perceived luminance, blue image data indicative of target blue sub-pixel perceived luminance, and/or green image data indicative of target green sub-pixel perceived luminance.

As described above, a pixel layout of a lower resolution panel section on a display panel may be determined to achieve a target pixel resolution, for example, by adapting the pixel layout of a corresponding high resolution panel section. However, even providing the same pixel resolution, at least in some instances, perceived image quality and/or light transmissiveness provided by different pixel layouts may nevertheless differ. As such, in some embodiments, a design device may be implemented and/or operated to determine (e.g., consider) multiple candidate pixel layouts that each provides a target pixel resolution of a lower resolution panel section. Additionally, the design device may determine perceived image quality and/or light transmissiveness expected to result from each of the candidate pixel layouts as well as a target perceived image quality and/or a target light transmissiveness to be provided by the lower resolution panel section. Based at least in part on comparisons between the target perceived image quality and an expected perceived image quality associated with each of the candidate pixel layouts and/or comparisons between the target light transmissiveness and an expected light transmissiveness associated with each of the candidate pixel layouts, the design device may then select a target pixel layout to be used to implement the lower resolution panel section.

Nevertheless, at least in some instances, perceived luminance of an area (e.g., portion) of a display panel may depend at least in part on pixel resolution implemented therein. For example, when each display pixel emits the same amount of light, perceived luminance of an area in a lower resolution panel section of the display panel may appear darker than perceived luminance of a same-sized area in a higher resolution panel section. As described above, image data corresponding with a display pixel (e.g., color component sub-pixel) implemented on a display panel may be indicative of its target luminance, for example, by indicating a target grayscale value (e.g., level) that is scaled (e.g., non-linearly) to a panel brightness setting.

To facilitate compensating for variations in perceived luminance resulting from differing pixel resolutions, in some embodiments, an electronic device may include image processing circuitry implemented and/or operated to process image data before the image data is supplied to a display panel to display a corresponding image. In particular, in some embodiments, the image processing circuitry may receive (e.g., from memory) source image data output from an image source, such as an image sensor (e.g., camera) and/or a processor (e.g., CPU and/or GPU) implemented in the electronic device. Based at least in part on pixel resolution surrounding a display pixel, the image processing circuitry may process corresponding source image data to determine (e.g., generate) display image data, which may then be supplied to the display panel to display a corresponding image.

To facilitate determining display image data that compensates for pixel resolution, in some embodiments, image processing circuitry may include a resolution compensation block (e.g., circuitry group) implemented and/or operated to determine one or more resolution compensation factors to be applied to input image data, such as source image data and/or image data output from upstream image processing circuitry, based at least in part on pixel resolution implemented in an area of the display panel that includes (e.g., surrounds) a corresponding display pixel. For example, the resolution compensation factors may include one or more offset values, which, when applied, biases (e.g., offset) the input image data. Additionally or alternatively, the resolution compensation factors may include one or more gain values, which, when applied, scals the image data.

To facilitate compensating for a lower pixel resolution, in some embodiments, a design device may calibrate the value of one or more resolution compensation factors to be applied to image data such that perceived luminance of an area in a lower resolution panel section generally matches perceived luminance in a same-sized area of a corresponding high resolution panel section. For example, in some embodiments, a gain resolution compensation factor to be applied to image data corresponding with a high (e.g., higher) resolution panel section may be a unity gain value whereas a gain resolution compensation factor to be applied to image data corresponding with a low (e.g., lower) resolution panel section may be greater than the unity gain value. As such, by applying one or more resolution compensation factors, the image processing circuitry (e.g., spatial transition block) may boost image data corresponding with the low resolution panel section relative to image data corresponding with the high resolution panel section to facilitate compensating for reduced light emission that may otherwise result from the lower pixel resolution and, thus, at least in some instances, may facilitate improving perceived image quality provided by the low resolution panel section.

However, at least in some instances, a sudden change in pixel resolution may nevertheless be perceivable and, thus, potentially affect perceived image quality provided by a display panel. In other words, at least in some instances, a transition (e.g., boundary) between a low resolution panel section and a high resolution panel section may be perceivable due to their differing pixel resolutions. To facilitate reducing perceivability of such a transition, in some embodiments, a display panel may include a resolution transition panel section implemented between its low resolution panel section and its high resolution panel section. In particular, in some embodiments, the resolution transition panel section may be implemented to gradually transition between a pixel resolution of the high resolution panel section and a pixel resolution of the low resolution panel section. In other words, in such embodiments, the resolution transition panel section may be implemented with a pixel resolution greater (e.g., higher) than the low resolution panel section and less (e.g., lower) than the high resolution panel section.

Additionally or alternatively, to facilitate reducing perceivability of a boundary between a high resolution panel section and an adjacent lower resolution (e.g., lower resolution transition) panel section of a display panel, in some embodiments, a portion of the high resolution panel section may be operated as a digital transition sub-section, for example, while a remaining portion of the high resolution panel section is operated as a full resolution sub-section. To facilitate operating a portion of the high resolution panel section as a digital transition sub-section, in some embodiments, image processing circuitry may apply different resolution compensation factors to image data corresponding with the digital transition sub-section compared to the resolution compensation factors applied to image data corresponding with a full resolution sub-section (e.g., remainder) of the high resolution panel section. For example, in some embodiments, a unity gain resolution compensation factor may be applied to image data corresponding with the full resolution sub-section in the high resolution panel section and a gain resolution compensation factor greater than the unity gain may be applied to image data corresponding with a low resolution panel section of the display panel. Thus, to facilitate reducing perceivability of a boundary between the high resolution panel section and the low resolution panel section, a gain resolution compensation factor to be applied to a line of display pixels in the digital transition sub-section, which is adjacent to the full resolution sub-section, may be greater than a unity gain. Additionally, moving from the full resolution sub-section toward the low resolution panel section, in some embodiments, the gain resolution compensation factors to be applied to image data corresponding with every other line of display pixels in the digital transition section may gradually increase.

Furthermore, as described above, in some embodiments, a pixel layout of a lower resolution panel section may be determined by removing one or more display pixels from a pixel layout of a corresponding high resolution panel section. Accordingly, at least in some embodiments, image data may correspond with a pixel location (e.g., position) in the low resolution panel section at which a display pixel is not actually implemented. In other words, effectively, a gain value of zero is being applied to image data corresponding with a removed display pixel, for example, after sub-sampling to account for pixel layout.

Thus, to facilitate reducing perceivability of a transition between a low resolution panel section and a high resolution panel section, in some embodiments, a gain resolution compensation factor to be applied to a line of display pixels in a digital transition sub-section of the high resolution panel section, which is adjacent to the low resolution panel section, may be between a zero gain value and a unity gain value. Additionally, moving from the low resolution panel section toward a full resolution sub-section of the high resolution panel section, in some embodiments, the gain resolution compensation factors to be applied to image data corresponding with every other line of display pixels in the digital transition section may gradually increase. In other words, to facilitate operating a portion of a high resolution panel section as a digital transition sub-section, moving from a full resolution sub-section of the high resolution panel section toward the low resolution panel section, in some such embodiments, gain resolution compensation factors may gradually decrease over the course of a first (e.g., even numbered) set of lines and gradually increase over the course of a second (e.g., odd numbered) set of lines.

In this manner, as will be described in more detail below, the techniques described in the present disclosure may facilitate reducing the perceivability of changes between multiple different pixel resolutions implemented on a display panel of an electronic display, which, at least in some instances, may facilitate improving perceived quality of an image being displayed on the display panel and, thus, potentially an electronic device in which the electronic display is deployed. By implementing multiple different pixel resolutions on a display panel, as will be described in more detail below, the techniques described in the present disclosure may facilitate balancing (e.g., optimizing and/or maximizing) perceived image quality provided by the display panel and real estate utilization in an electronic device that includes the display panel, for example, by including a higher (e.g., high) resolution panel section and a lower (e.g., low) resolution panel section behind which one or more optical (e.g., light) sensors may be deployed. Moreover, as will be described in more detail below, the techniques described in the present disclosure may facilitate compensating for perceivable luminance variations resulting from the pixel resolution of a lower resolution panel section of a display panel in an electronic display, which, at least in some instances, may facilitate improving perceived quality of an image being displayed on the display panel and, thus, potentially an electronic device in which the electronic display is deployed.

To help illustrate, an example of an electronic device 10, which includes and/or utilizes an electronic display 12, is shown in FIG. 1. As will be described in more detail below, the electronic device 10 may be any suitable electronic device, such as a computer, a mobile (e.g., portable) phone, a portable media device, a tablet device, a television, a handheld game platform, a personal data organizer, a virtual-reality headset, a mixed-reality headset, a vehicle dashboard, and/or the like. Thus, it should be noted that FIG. 1 is merely one example of a particular implementation and is intended to illustrate the types of components that may be present in an electronic device 10.

In addition to the electronic display 12, as depicted, the electronic device 10 includes one or more input devices 14, one or more input/output (I/O) ports 16, a processor core complex 18 having one or more processors or processor cores, main memory 20, one or more storage devices 22, a network interface 24, a power supply 26, and image processing circuitry 27. The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components. For example, the main memory 20 and a storage device 22 may be included in a single component. Additionally or alternatively, the image processing circuitry 27 may be included in the processor core complex 18 or the electronic display 12.

As depicted, the processor core complex 18 is operably coupled with main memory 20 and the storage device 22. As such, in some embodiments, the processor core complex 18 may execute instructions stored in main memory 20 and/or a storage device 22 to perform operations, such as generating image data. Additionally or alternatively, the processor core complex 18 may operate based on circuit connections formed therein. As such, in some embodiments, the processor core complex 18 may include one or more general purpose microprocessors, one or more application specific processors (ASICs), one or more field programmable logic arrays (FPGAs), or any combination thereof.

In addition to instructions, in some embodiments, the main memory 20 and/or the storage device 22 may store data, such as image data. Thus, in some embodiments, the main memory 20 and/or the storage device 22 may include one or more tangible, non-transitory, computer-readable media that store instructions executable by processing circuitry, such as the processor core complex 18 and/or the image processing circuitry 27, and/or data to be processed by the processing circuitry. For example, the main memory 20 may include random access memory (RAM) and the storage device 22 may include read only memory (ROM), rewritable non-volatile memory, such as flash memory, hard drives, optical discs, and/or the like.

As depicted, the processor core complex 18 is also operably coupled with the network interface 24. In some embodiments, the network interface 24 may enable the electronic device 10 to communicate with a communication network and/or another electronic device 10. For example, the network interface 24 may connect the electronic device 10 to a personal area network (PAN), such as a Bluetooth network, a local area network (LAN), such as an 802.11x Wi-Fi network, and/or a wide area network (WAN), such as a 4G or LTE cellular network. In other words, in some embodiments, the network interface 24 may enable the electronic device 10 to transmit data (e.g., image data) to a communication network and/or receive data from the communication network.

Additionally, as depicted, the processor core complex 18 is operably coupled to the power supply 26. In some embodiments, the power supply 26 may provide electrical power to operate the processor core complex 18 and/or other components in the electronic device 10, for example, via one or more power supply rails. Thus, the power supply 26 may include any suitable source of electrical power, such as a rechargeable lithium polymer (Li-poly) battery and/or an alternating current (AC) power converter.

Furthermore, as depicted, the processor core complex 18 is operably coupled with one or more I/O ports 16. In some embodiments, the I/O ports 16 may enable the electronic device 10 to interface with another electronic device 10. For example, a portable storage device may be connected to an I/O port 16, thereby enabling the electronic device 10 to communicate data, such as image data, with the portable storage device.

As depicted, the processor core complex 18 is also operably coupled with one or more input devices 14. In some embodiments, an input device 14 may enable a user to interact with the electronic device 10. For example, the input devices 14 may include one or more buttons, one or more keyboards, one or more mice, one or more trackpads, and/or the like. Additionally, in some embodiments, the input devices 14 may include touch sensing components implemented in the electronic display 12. In such embodiments, the touch sensing components may receive user inputs by detecting occurrence and/or position of an object contacting the display surface of the electronic display 12.

In addition to enabling user inputs, the electronic display 12 may facilitate providing visual representations of information by displaying one or more images (e.g., image frames or pictures). For example, the electronic display 12 may display a graphical user interface (GUI) of an operating system, an application interface, text, a still image, or video content. To facilitate displaying images, as will be described in more detail below, the electronic display 12 may include a display panel with one or more display pixels.

As described above, an electronic display 12 may display an image by controlling luminance of its display pixels based at least in part on image data associated with corresponding image pixels (e.g., points) in the image. In some embodiments, image data may be generated by an image source, such as the processor core complex 18, a graphics processing unit (GPU), and/or an image sensor. Additionally, in some embodiments, image data may be received from another electronic device 10, for example, via the network interface 24 and/or an I/O port 16. In any case, as described above, the electronic device 10 may be any suitable electronic device.

Figure 2:
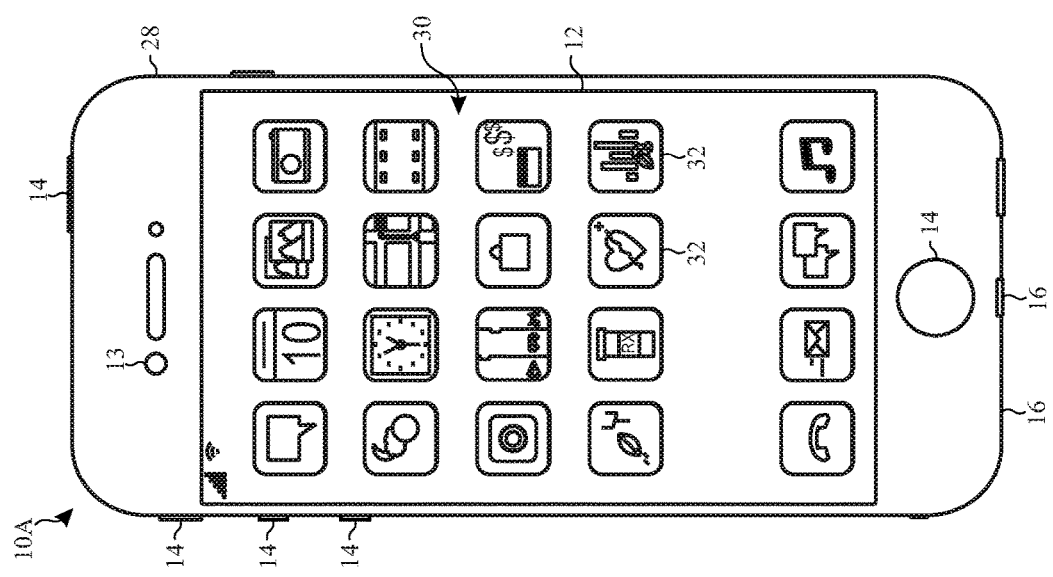
FIG. 2 is an example of the electronic device of FIG. 1, in accordance with an embodiment of the present disclosure.

To help illustrate, one example of a suitable electronic device 10, specifically a handheld device 10A, is shown in FIG. 2. In some embodiments, the handheld device 10A may be a portable phone, a media player, a personal data organizer, a handheld game platform, and/or the like. For example, the handheld device 10A may be a smart phone, such as any iPhone® model available from Apple Inc.

As depicted, the handheld device 10A includes an enclosure 28 (e.g., housing). In some embodiments, the enclosure 28 may protect interior components from physical damage and/or shield them from electromagnetic interference. Additionally, as depicted, the enclosure 28 surrounds the electronic display 12. In the depicted embodiment, the electronic display 12 is displaying a graphical user interface (GUI) 30 having an array of icons 32. By way of example, when an icon 32 is selected either by an input device 14 or a touch sensing component of the electronic display 12, an application program may launch.

Furthermore, as depicted, input devices 14 open through the enclosure 28. As described above, the input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, and/or toggle between vibrate and ring modes. As depicted, the I/O ports 16 also open through the enclosure 28. In some embodiments, the I/O ports 16 may include, for example, an audio jack to connect to external devices.

Figure 3:
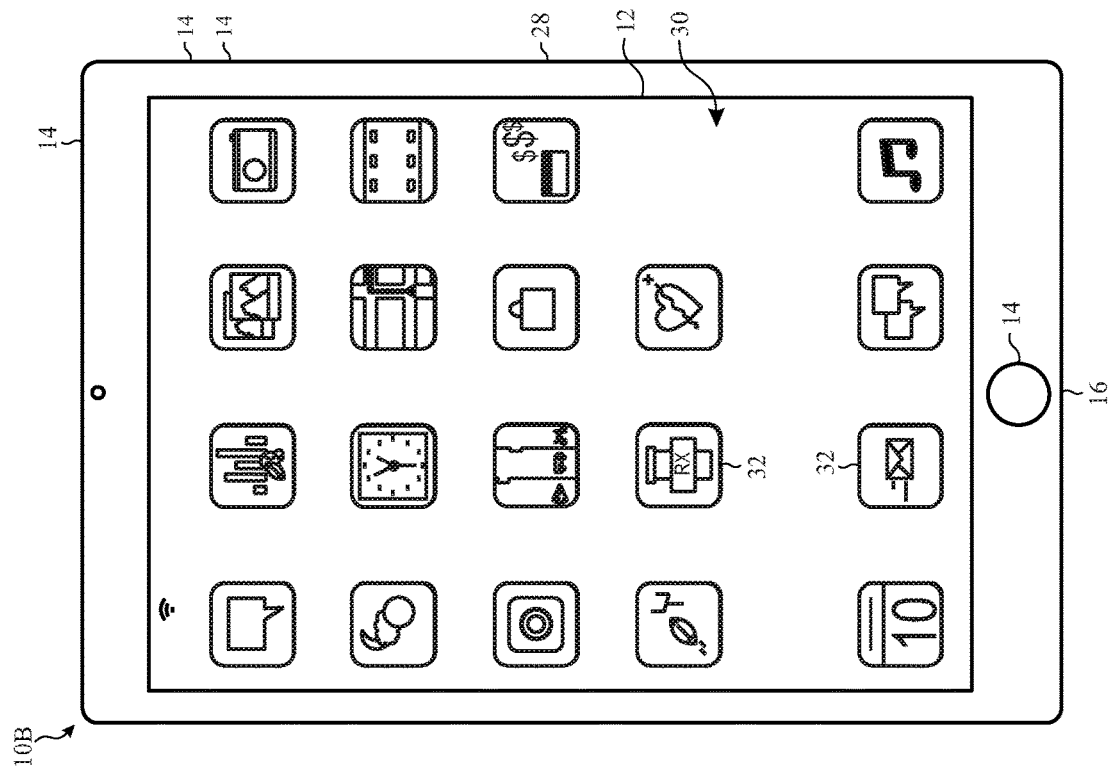
FIG. 3 is another example of the electronic device of FIG. 1, in accordance with an embodiment of the present disclosure.
Figure 4:
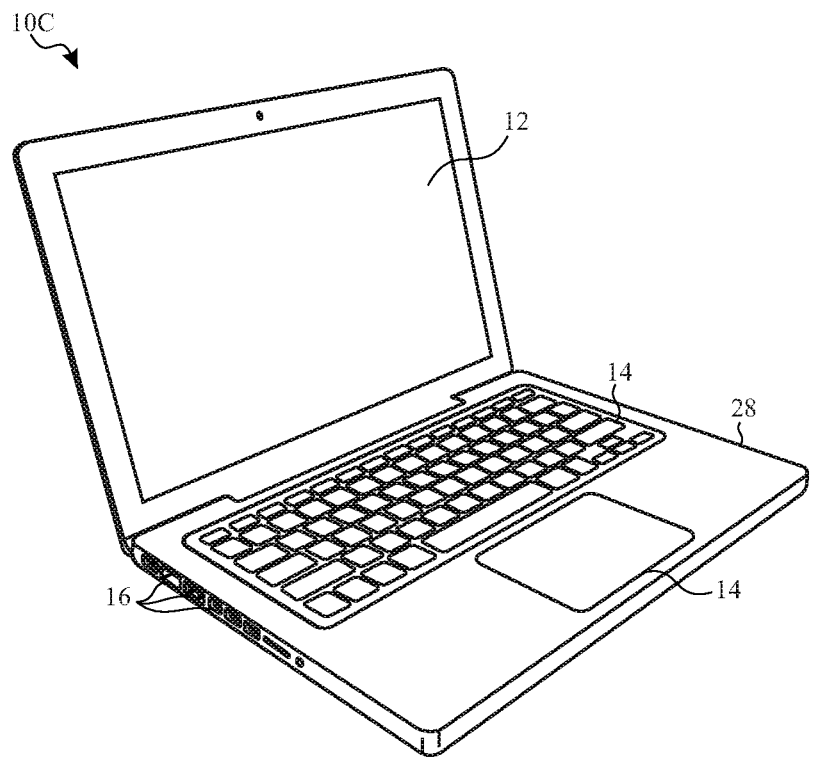
FIG. 4 is another example of the electronic device of FIG. 1, in accordance with an embodiment of the present disclosure.
Figure 5:
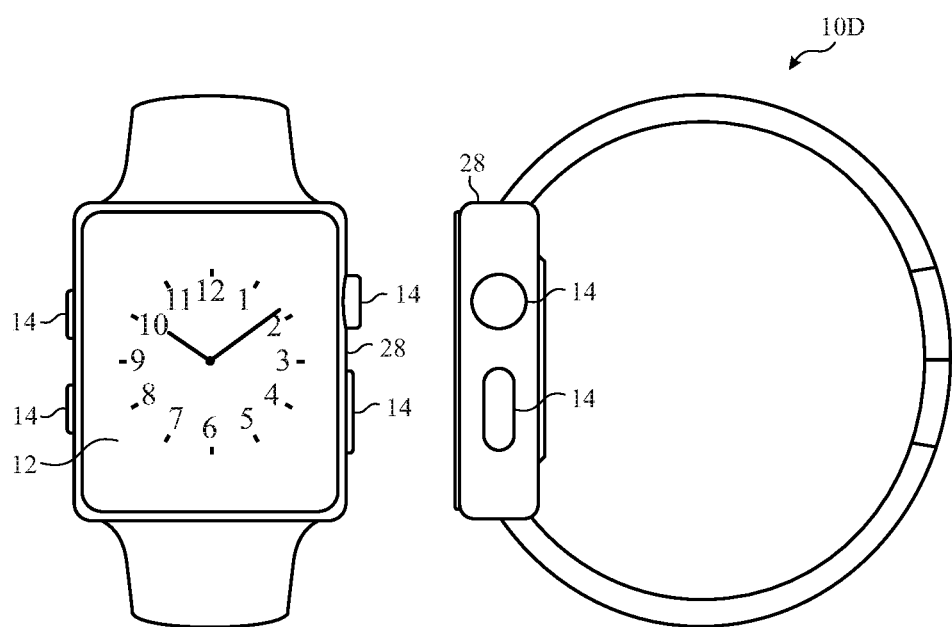
FIG. 5 is another example of the electronic device of FIG. 1, in accordance with an embodiment of the present disclosure.

To help further illustrate, another example of a suitable electronic device 10, specifically a tablet device 10B, is shown in FIG. 3. For illustrative purposes, the tablet device 10B may be any iPad® model available from Apple Inc. A further example of a suitable electronic device 10, specifically a computer 10C, is shown in FIG. 4. For illustrative purposes, the computer 10C may be any Macbook® or iMac® model available from Apple Inc. Another example of a suitable electronic device 10, specifically a watch 10D, is shown in FIG. 5. For illustrative purposes, the watch 10D may be any Apple Watch® model available from Apple Inc. As depicted, the tablet device 10B, the computer 10C, and the watch 10D each also includes an electronic display 12, input devices 14, I/O ports 16, and an enclosure 28. In any case, as described above, an electronic display 12 may generally display images based at least in part on image data, for example, output from the processor core complex 18 and/or the image processing circuitry 27.

Figure 6:
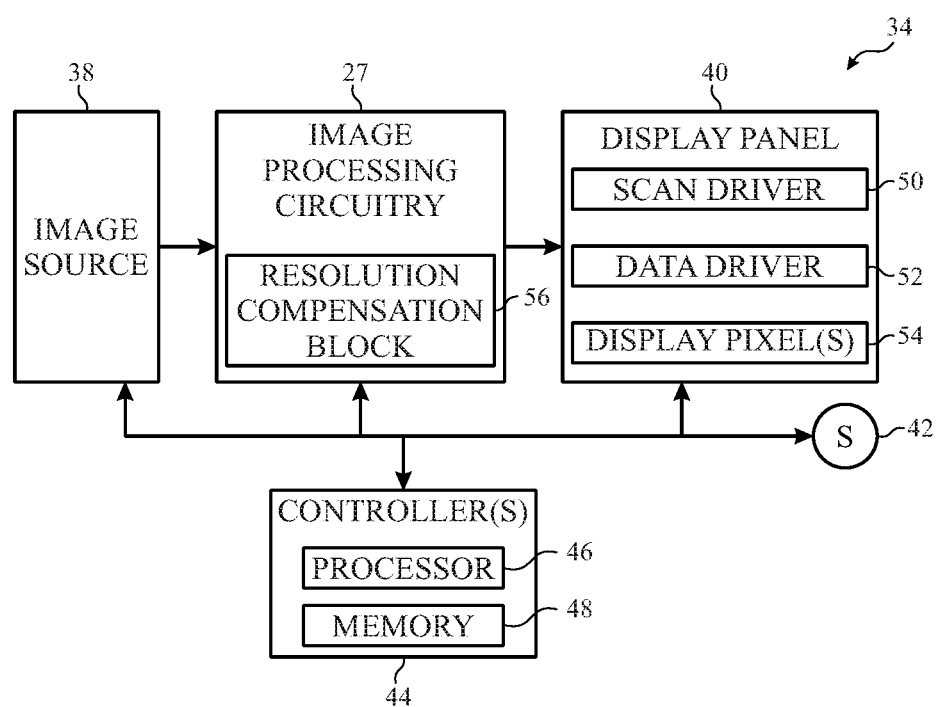
FIG. 6 is a block diagram of an example portion of the electronic display of FIG. 1 including image processing circuitry and a display panel, in accordance with an embodiment of the present disclosure.

To help illustrate, an example of a portion 34 of an electronic device 10, which includes an image source 38 and a display panel 40 of an electronic display 12, is shown in FIG. 6. Generally, the image source 38 may be implemented and/or operated to generate source image data corresponding with an image to be displayed on the display panel 40. Thus, in some embodiments, the image source 38 may be a processor core complex 18, a graphics processing unit (GPU), an image sensor (e.g., camera), and/or the like.

To facilitate displaying images, as in the depicted example, the display panel 40 may include one or more display pixels 54 and driver circuitry, which includes a scan driver 50 and a data driver 52. In some embodiments, each display pixel 54 may emit light of a specific color component, such as a red color component, a blue color component, or a green color component. In other words, as used herein, a "display pixel" may refer to a color component sub-pixel, such as a red sub-pixel that emits red light, a blue sub-pixel that emits blue light, a green sub-pixel that emits green light, or a white sub-pixel that emits white light.

Additionally, in some embodiments, multiple display pixels 54 (e.g., color component sub-pixels) implemented on a display panel 40 may be grouped into display pixel units. For example, the display panel may include multiple display pixel units, which each includes a blue display pixel 54, a red display pixel 54, and a green display pixel 54. Additionally or alternatively, the display panel 40 may include a first set of display pixel units, which each includes a blue display pixel 54 and a green display pixel 54, and a second set of display pixel units, which each includes a red display pixel 54 and a green display pixel 54.

Furthermore, in some embodiments, light emission from a display pixel 54 may vary with the magnitude of electrical energy stored therein. For example, in some instances, a display pixel 54 may include a light emissive element, such as an organic light-emitting diode (OLED), that varies its light emission with current flow therethrough, a current control switching device (e.g., transistor) coupled between the light emissive element and a pixel power (e.g., VDD) supply rail, and a storage capacitor coupled to a control (e.g., gate) terminal of the current control switching device. As such, varying the amount of energy stored in the storage capacitor may vary voltage applied to the control terminal of the current control switching device and, thus, magnitude of electrical current supplied from the pixel power supply rail to the light emissive element of the display pixel 54.

However, it should be appreciated that discussion with regard to OLED display pixels 54, OLED display panels 40, and OLED electronic displays 12 is merely intended to be illustrative and not limiting. In other words, the techniques described in the present disclosure may be applied to and/or adapted for other types of electronic displays 12, such as a liquid crystal display (LCD) electronic display 12 and/or a micro light-emitting diode (LED) electronic display 12. In any case, since light emission from a display pixel 54 generally varies with electrical energy storage therein, to display an image, a display panel 40 may write a display pixel 54 at least in part by supplying an analog electrical (e.g., voltage and/or current) signal to the display pixel 54, for example, to charge and/or discharge a storage capacitor implemented in the display pixel 54.

To facilitate writing an image, in some embodiments, each display pixel 54 may be coupled to the scan driver 50 via a corresponding scan line and to the data driver 52 via a corresponding data line. In particular, the scan driver 50 may be coupled to each display pixel 54 included in a row of display pixel units via a corresponding scan line. In other words, as used herein, a "display pixel row" may be a group of display pixels 54 each coupled to the same scan line. Additionally, the data driver 52 may be coupled to each display pixel 54 included in a display pixel column via a corresponding data line. In other words, as used herein, a "display pixel row" may be a group of display pixels 54 each coupled to the same data line.

In this manner, the display panel 40 may selectively write its display pixels 54. In particular, in some embodiments, the display panel 40 may successively write an image to its display pixel rows. For example, to write a display pixel row, the scan driver 50 may output an activation (e.g., logic high) control signal to a corresponding scan line that causes each display pixel 54 coupled to the scan line to electrically couple its storage capacitor to a corresponding data line. Additionally, the data driver 52 may output an analog electrical signal to each data line coupled to an activated display pixel 54 to control amount of electrical energy stored in the display pixel 54 and, thus, resulting light emission (e.g., perceived luminance).

As described above, image data corresponding with a display pixel 54 on a display panel 40 may be indicative of its target luminance, for example, by indicating a target grayscale value (e.g., level) that is scaled (e.g., mapped) to a panel brightness setting. In other words, to display an image, the display panel 40 may control supply (e.g., magnitude and/or duration) of analog electrical signals from its data driver 52 to its display pixels 54 based at least in part on corresponding image data. To facilitate improving perceived image quality, as in the depicted example, the portion 34 of the electronic device 10 may include image processing circuitry 27 coupled between the image source 38 and the display panel 40.

In particular, the image processing circuitry 27 may be implemented and/or operated to process image data output from the image source 38 before the image data is used to display a corresponding image on the display panel 40. Thus, in some embodiments, the image processing circuitry 27 may be included in the processor core complex 18, a display pipeline (e.g., chip or integrated circuit device), a timing controller (TCON) in the electronic display 12, or any combination thereof. Additionally or alternatively, the image processing circuitry 27 may be implemented as a system-on-chip (SoC).

In other words, the image processing circuitry 27 may be implemented and/or operated to process source image data output from the image source 38. In some embodiments, the image processing circuitry 27 may directly receive the source image data from the image source 38. Additionally or alternatively, the source image data output from the image source 38 may be stored in a tangible, non-transitory, computer-readable medium, such as main memory 20, and, thus, the image processing circuitry 27 may receive (e.g., retrieve) the source image data from the tangible, non-transitory, computer-readable medium, for example, via a direct memory access (DMA) technique.

The image processing circuitry 27 may then process the source image data to generate display image data, for example, which adjusts target luminance to compensate for pixel resolution implemented on the display panel 40, ambient lighting conditions, pixel (e.g., sub-pixel) layout of the display panel 40, burn-in on the display panel 40, expected response of the display panel 40, or any combination thereof. The display (e.g., processed) image data may then be supplied (e.g., output) to the display panel 40 to enable display panel 40 to display a corresponding image based at least in part on the display image data. Due to the processing (e.g., compensation) performed by the image processing circuitry 27, at least in some instances, displaying an image based on corresponding display image data may facilitate improving perceived image quality, for example, compared to displaying the image directly using corresponding source image data.

In some embodiments, the image processing circuitry 27 may be organized into one or more image processing blocks (e.g., circuitry groups). For example, the image processing circuitry 27 may include a resolution compensation block 56 implemented and/or operated to process input image data to compensate for pixel resolution around a corresponding display pixel 54. As will be described in more detail below, to facilitate compensating for pixel resolution, in some embodiments, the resolution compensation block 56 may determine one or more pixel resolution compensation factors based at least in part on the surrounding pixel resolution and apply the one or more pixel response compensation factors to the input image data. In some embodiments, the image processing circuitry 27 may additionally or alternatively include an ambient adaptive pixel (AAP) block, a dynamic pixel backlight (DPB) block, a white point correction (WPC) block, a sub-pixel layout compensation (SPLC) block, a burn-in compensation (BIC) block, a panel response correction (PRC) block, a dithering block, a sub-pixel uniformity compensation (SPUC) block, a content frame dependent duration (CDFD) block, an ambient light sensing (ALS) block, or any combination thereof.

Moreover, as in the depicted example, the portion 34 of the electronic device 10 may include a controller (e.g., control circuitry and/or control logic) 44 and one or more sensors 42, such as a temperature sensor 42, a movement (e.g., accelerometer and/or gyroscope) sensor 42, and/or an optical (e.g., light) sensor 42. In some embodiments, the controller 44 may receive sensor data, such as image data, output from a sensor 42, such as an optical sensor 42 (e.g., camera). Additionally, in some embodiments, the controller 44 may generally control operation of image source 38, the image processing circuitry 27, the one or more sensors 42, the display panel 40, or any combination thereof. Although depicted as a single controller 44, in other embodiments, one or more separate controllers 44 may be used to control operation of the image source 38, the image processing circuitry 27, the display panel 40, or any combination thereof.

To facilitate controlling operation, as in the depicted example, the controller 44 may include a controller processor 46 and controller memory 48. In some embodiments, the controller processor 46 may be included in the processor core complex 18 and/or separate processing circuitry and the controller memory 48 may be included in main memory 20, a storage device 22, and/or a separate, tangible, non-transitory computer-readable medium. Additionally, in some embodiments, the controller processor 46 may execute instructions and/or process data stored in the controller memory 48 to control operation of the image source 38, the image processing circuitry 27, the display panel 40, and/or the one or more sensors 42. In other embodiments, the controller processor 46 may be hardwired with instructions that, when executed, control operation of the image source 38, the image processing circuitry 27, the display panel 40, and/or the one or more sensors 42.

As described above, in some embodiments, sensors 42 implemented in an electronic device 10 may include one or more optical sensors 42. For example, an optical sensor 42 deployed in the electronic device 10 may be an ambient light sensor 42, which is implemented and/or operated to sense (e.g., measure) environmental lighting conditions. Additionally or alternatively, an optical sensor 42 deployed in the electronic device 10 may be an image sensor 42, such as a camera, which is implemented and/or operated to capture an image by generating (e.g., outputting) image data, which provides a digital representation of the image, based at least in part on sensed light.

Since used to sense light, one or more optical sensors 42 are often implemented (e.g., disposed) along an external surface of the electronic device 10. Additionally, since used to display images that provide visual representations of information, a display panel 40 is also often implemented along one or more external surfaces of the electronic device 10. In fact, in some embodiments, a display panel 40 and a sensor 42 may be implemented along the same external surface of the electronic device 10. For example, the display panel 40 and the sensor 42 may both be implemented along a front-facing surface of the electronic device 10, a back-facing surface of the electronic device 10, a top-facing surface of the electronic device 10, a bottom-facing surface of the electronic device 10, a left-facing surface of the electronic device 10, a right-facing surface of the electronic device 10, or any combination thereof.

However, real estate (e.g., space) in an electronic device—particularly along an external surface—is often limited, for example, to facilitate reducing physical size (e.g., physical footprint) of the electronic device 10 in an effort to improve its portability. Thus, to facilitate optimizing (e.g., maximizing) available real estate, in some embodiments, a display panel 40 and one or more sensors 42 may be implemented (e.g., disposed) along overlapping portions of an external surface. For example, the display panel 40 may be implemented along a front-facing surface of the electronic device 10 and the one or more sensors 42 may be implemented behind the display panel 40 and, thus, overlap with the display panel 40 along the front-facing surface of the electronic device 10.

Figure 7:
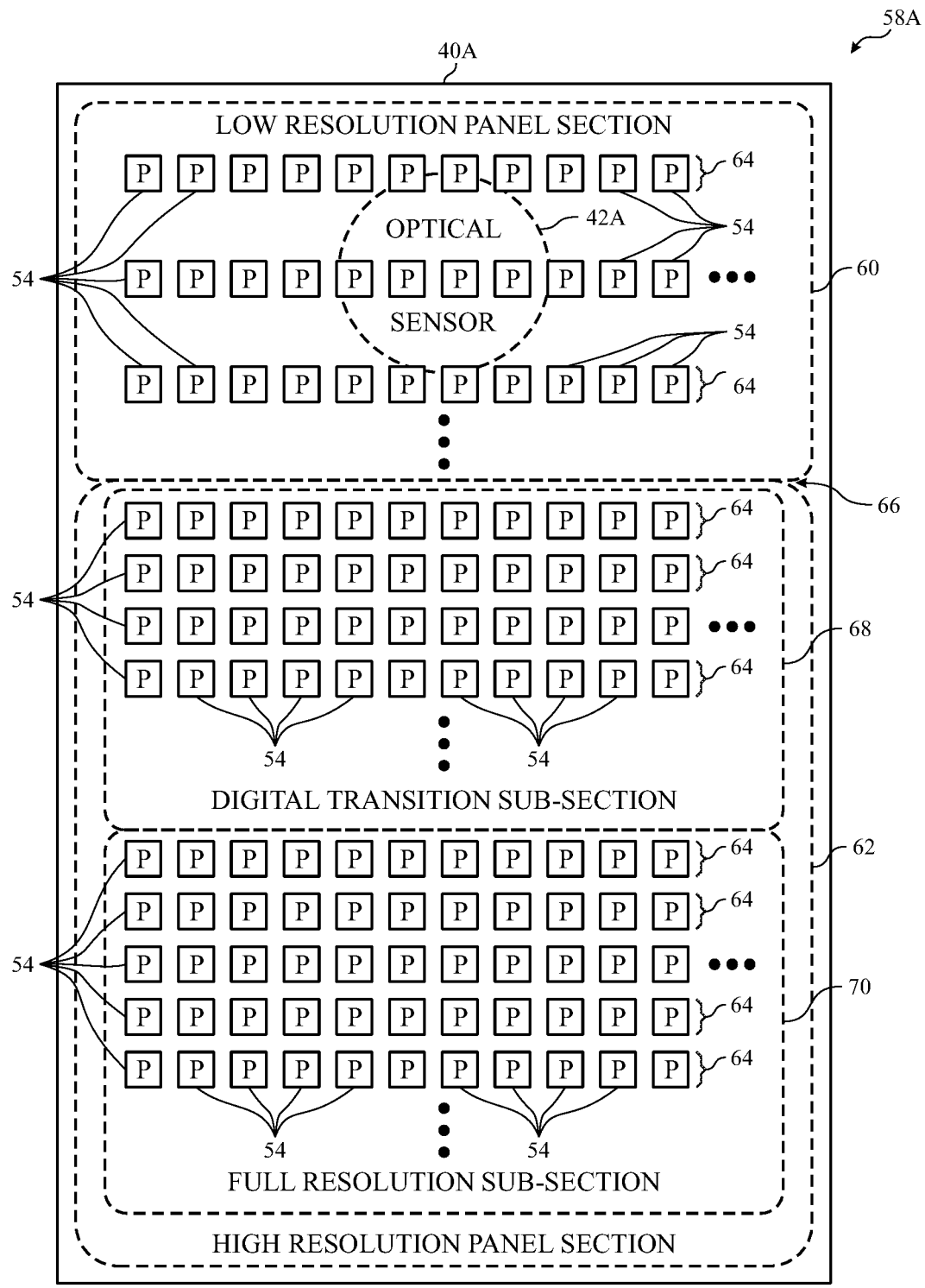
FIG. 7 is a diagrammatic representation of an example of a portion of the electronic display of FIG. 1 including the display panel of FIG. 6 implemented with multiple different resolution panel sections, in accordance with an embodiment of the present disclosure.

To help illustrate, an example of a portion 58B of an electronic device 10, which includes a display panel 40A and an optical sensor 42A, is shown in FIG. 7. However, it should be appreciated that the depicted example is merely intended to illustrative and not limiting. For example, in other embodiments, the portion 58B of the electronic device 10 may include two or more optical sensors 42A.

As in the depicted example, the optical sensor 42A may be implemented behind the display panel 40A. In other words, the display panel 40A may be implemented between the optical sensor 42A and an external surface of the electronic device 10. As such, the optical sensor 42A may be implemented and/or operated to sense light that passes through the external surface of the electronic device 10 and light transmissive (e.g., transparent) material implemented in the display panel 40A.

However, at least in some instances, the display panel 40A may also include opaque (e.g., non-light transmissive) material, for example, which is used to implement switching devices (e.g., transistors) in it display pixels 54, storage capacitors in its display pixels 54, data lines coupled to its display pixels 54, and/or scan lines coupled to its display pixels 54. In other words, at least in some instances, opaque material implemented in the display panel 40A may block light from reaching an optical sensor 42A disposed behind the display panel 40A and, thus, potentially affect (e.g., reduce) the ability of the optical sensor 42A to accurately sense light that passes through the external surface of the electronic device 10. In fact, at least in some instances, the amount of opaque material that blocks light from reach an optical sensor 42A may depend at least in part on the number of display pixels 54 and, thus, pixel resolution implemented in front of (e.g., overlapping with) the optical sensor 42A. However, at least in some instances, perceived quality of an image displayed on a display panel 40A may also vary with pixel resolution, for example, due to a lower pixel resolution reducing the ability to depict details of an image compared to a higher pixel resolution.

Thus, to enable an optical sensor 42A to be disposed behind a display panel 40 while improving perceived image quality provided by the display panel 40, in some embodiments, the display panel 40 may be implemented with multiple sections that each has a different pixel resolution. For example, the display panel 40A may include a low (e.g., lower) resolution panel section 60 implemented with a lower (e.g., downsampled) pixel resolution and a high (e.g., higher) resolution panel section 62 implemented with a higher (e.g., full) pixel resolution. Additionally, in some embodiments, the pixel resolution of the low resolution panel section 60 may be a fraction of the pixel resolution implemented in the high resolution panel section 62. For example, in some such embodiments, the low resolution panel section 60 may be implemented with a pixel resolution that is half the pixel resolution of the high resolution panel section 62. In other embodiments, the low resolution panel section 60 may be implemented with a pixel resolution that is a different fraction (e.g., a third or a quarter) of the pixel resolution of the high resolution panel section 62.

As will be described in more detail below, in some embodiments, multiple different pixel layouts may provide the same pixel resolution. In fact, in some embodiments, the pixel layout of the low resolution panel section 60 may be determined by adapting the pixel layout of the high resolution panel section 62 to achieve a target pixel resolution of the low resolution panel section 60. For example, to implement a target pixel resolution that is half the pixel resolution of the high resolution panel section 62, the pixel layout of the low resolution panel section 60 may be determined by removing every other line 64 of display pixels 54 from the pixel layout of the high resolution panel section 62.

As in the depicted example, a line 64 of display pixels 54 may be a horizontal line of display pixels 54. As such, in some embodiments, a line 64 of display pixels 54 may correspond with a display pixel row, which includes each of the display pixels 54 coupled to a corresponding (e.g., single) scan line. However, it should be noted that, as used in the present disclosure, a "line of display pixels" does not necessarily correspond with a "display pixel row." For example, in other embodiments, a line 64 of display pixels 54 may be a vertical line of display pixels 54. Thus, in such embodiments, a line 64 of display pixels 54 may correspond with one or more display pixel columns, which each includes the display pixels 54 coupled to a corresponding (e.g., single) data line. Additionally or alternatively, a line 64 of display pixels 54 may include display pixels 54 implemented in multiple different display pixel rows. For example, a line 64 of display pixels 54 may include one or more display pixels 54 implemented in a first display pixel row as well as one or more display pixels 54 implemented in a second display pixel row adjacent the first display pixel row.

To facilitate improving the ability of an optical sensor 42A to accurately sense light that passes through the external surface of the electronic device 10, as in the depicted example, the optical sensor 42A may be implemented (e.g., disposed) behind the low resolution panel section 60. Due to the lower pixel resolution of the low resolution panel section 60, implementing the optical sensor 42A in this manner may facilitate reducing the amount of light that is blocked from reaching the optical sensor 42A by opaque material implemented in the display panel 40A, for example, compared to implementing the optical sensor 42A behind the high resolution panel section 62 of the display panel 40A. In other words, implementing the optical sensor 42A behind the low resolution panel section 60 may facilitate increasing the amount of light that passes through the external surface of the electronic device 10 and actually reaches the optical sensor 42A, which, at least in some instances, may facilitate improving the ability of the optical sensor 42A to accurately sense light that passes through the external surface of the electronic device 10.

Moreover, as in the depicted example, the display panel 40A may be implemented such that the low resolution panel section 60 and the high resolution panel section 62 are directly adjacent to one another. However, at least in some instances, a sudden change in pixel resolution may be perceivable, for example, as a visual artifact that affects (e.g., reduces) perceived image quality. In other words, due to their different pixel resolutions, at least in some instances, a boundary 66 between the low resolution panel section 60 and the high resolution panel section 62 may be perceivable and, thus, potentially affect perceived image quality provided by the display panel 40A.

To facilitate reducing perceivability of a transition between a low resolution panel section 60 and a high resolution panel section 62, as will be described in more detail below, in some embodiments, a display panel 40 may include a resolution transition panel section implemented between its low resolution panel section 60 and its high resolution panel section 62. Additionally or alternatively, as in the depicted example, a portion of the high resolution panel section 62 adjacent the low resolution panel section 60 may be operated as a digital transition sub-section 68 while another (e.g., remaining) portion of the high resolution panel section 62 is operated as a full resolution sub-section 70. In particular, as will be described in more detail below, a portion of the high resolution panel section 62 may be operated as a full resolution sub-section 70 by processing corresponding image data to utilize the full pixel resolution of the high resolution panel section 62, for example, via image processing circuitry 27.

On the other hand, as will be described in more detail below, a portion of the high resolution panel section 62 may be operated as a digital transition sub-section 68 to produce a perceived pixel resolution that gradually transitions between the lower pixel resolution of the low resolution panel section 60 and the full pixel resolution of the high resolution panel section 62. However, as in the depicted example, the digital transition sub-section 68 may nevertheless be implemented with the full pixel resolution of the high resolution panel section 62. Thus, to facilitate operating a portion of the high resolution panel section 62 as a digital transition sub-section 68, in some embodiments, image processing circuitry 27 may process corresponding image data such that its actual (e.g., full) pixel resolution is perceived as gradually transitioning between the lower pixel resolution of the low resolution panel section 60 and the full pixel resolution of the high resolution panel section 62. In this manner, an electronic device 10 may be implemented to optimize (e.g., maximize) real estate in the electronic device 10 while improving perceived image quality provided by its display panel 40.

Figure 8:
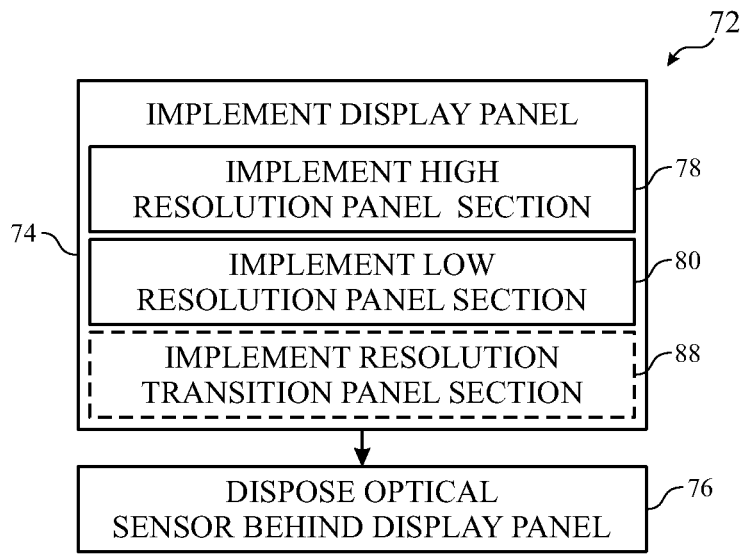
FIG. 8 is a flow diagram of an example process for implementing the portion of the electronic display of FIG. 7, in accordance with an embodiment of the present disclosure.

To help further illustrate, an example of a process 72 for implementing a portion of an electronic device 10 is described in FIG. 8. Generally, the process 72 includes implementing a display panel (process block 74) and disposing an optical sensor behind the display panel (process block 76). Although described in a particular order, which represents a particular embodiment, it should be noted that the process 72 may be performed in any suitable order, for example, such that an optical sensor 42A is implemented and a display panel 40 is disposed above (e.g., on top of) the optical sensor 42A.

Additionally, embodiments of the process 72 may omit process blocks and/or include additional process blocks. Furthermore, in some embodiments, the process 72 may be performed at least in part by a manufacturer and/or a system integrator that produces the portion of the electronic device 10, for example, with the assistance of a design device that determines a pixel layout to be used to implement a display panel 40. Thus, in some embodiments, the process 72 may be performed at least in part by executing instructions stored in a tangible, non-transitory, computer-readable medium, such as design device memory, using processing circuitry, such as a design device processor.

For example, to facilitate implementing a display panel 40, a design device may evaluate multiple candidate pixel layouts to be considered for the display panel 40. A pixel layout may indicate location and/or color component of display pixels 54 on a display panel 40. Thus, in some embodiments, the design device may evaluate candidate pixel layouts that are expected to achieve one or more target pixel resolutions of the display panel 40. However, even when implemented to provide the same pixel resolution, at least some instances, perceived image quality and/or light transmissiveness provided by different pixel layouts may nevertheless differ. As such, in some embodiments, the design device may evaluate an expected perceived image quality associated with each of the candidate pixel layouts (e.g., against a target perceived image quality) and/or an expected light transmissiveness associated with each of the candidate pixel layouts.

Based at least in part on its evaluation, the design device may select a target pixel layout to be used to implement (e.g., manufacture) the display panel 40 (process block 74). In some embodiments, the display panel 40 may be implemented at least in part by implementing (e.g., forming and/or disposing) appropriate color component display pixels 54 at pixel locations identified by the target pixel layout, implementing scan lines to couple each display pixel row to its scan driver 50, and implementing data lines to couple each display pixel column to a data driver 52. As described above, in some embodiments, a display panel 40 may be implemented with a high resolution panel section 62 having a higher target pixel resolution and a low resolution panel section 60 having a lower target pixel resolution. Thus, in such embodiments, implementing the display panel 40 may include implementing the high resolution panel section 62 (process block 78) and implementing the low resolution panel section 60 (process block 80). In particular, to facilitate implementing the high resolution panel section 62, the design device may determine a target high resolution pixel layout that achieves its higher target pixel resolution.

Figure 9:
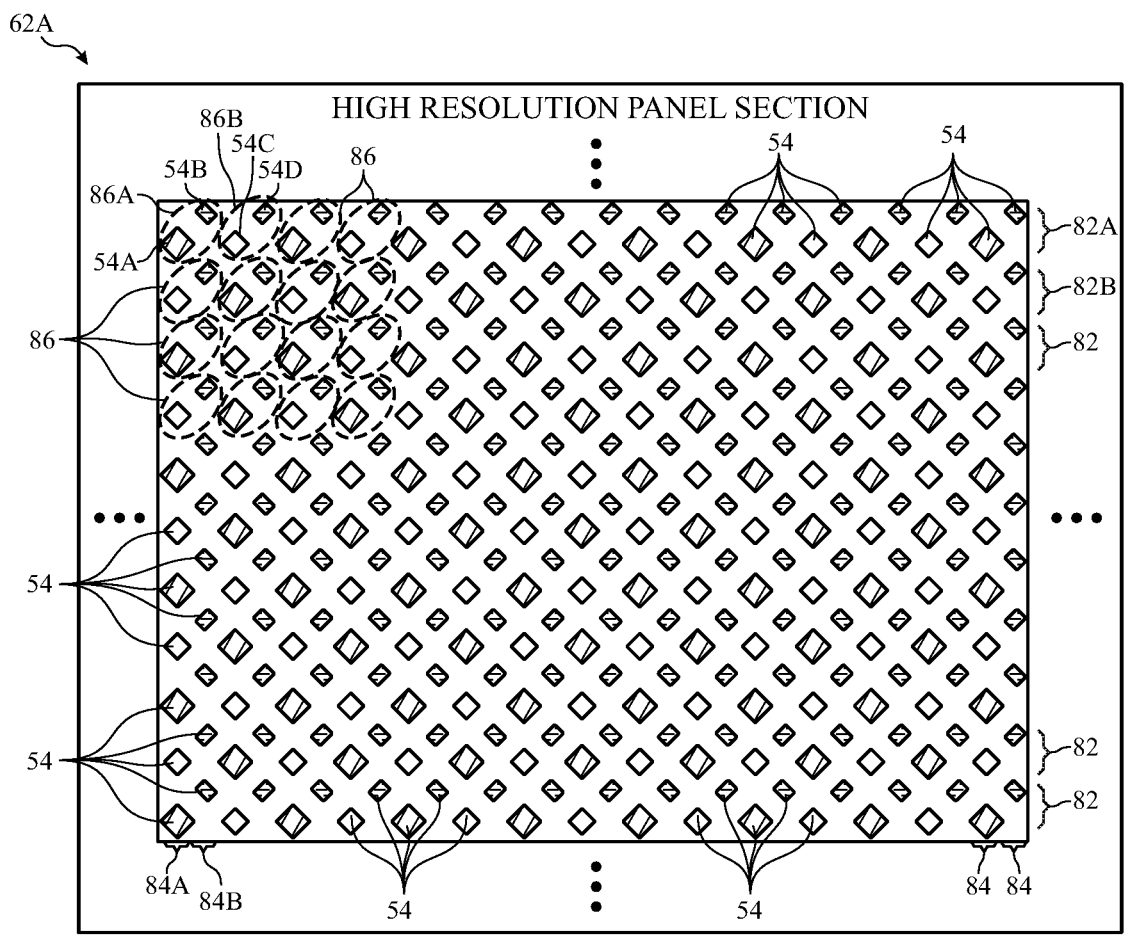
FIG. 9 is an example of a high resolution panel section implemented in the portion of the electronic display of FIG. 7, in accordance with an embodiment of the present disclosure.

To help illustrate, an example pixel layout of a high resolution panel section 62A is shown in FIG. 9. As in the depicted example, display pixels 54 in the high resolution panel section 62A may be organized into display pixel rows 82 and display pixel columns 84. In some embodiments, a display pixel row 82 may include each of the display pixels 54 coupled to a corresponding (e.g., single) scan line. For example, a first display pixel row 82A may include each of the display pixels 54 coupled to a first scan line, a second display pixel row 82B may include each of the display pixels 54 coupled to a second scan line, and so on. Additionally, in some embodiments, a display pixel column 84 may include each of the display pixels 54 coupled to a corresponding (e.g., single) data line. For example, a first display pixel column 84A may include each of the display pixels 54 coupled to a first data line, a second display pixel column 8BB may include each of the display pixels 54 coupled to a second data line, and so on.

As described above, to facilitate displaying an image on a display panel 40, a display pixel 54 may be implemented and/or operated to control light emission and, thus, perceived luminance of a specific color component. For example, a first display pixel 54A may be implemented to control blue light emission and a second display pixel 54B may be implemented to control green light emission. Additionally or alternatively, a third display pixel 54C may be implemented to control red light emission and a fourth display pixel 54D may be implemented to control green light emission.

Furthermore, as in the depicted example, multiple display pixels 54 may be grouped together as a display pixel unit 86. For example, a first display pixel unit 86A may include the first display pixel 54A and the second display pixel 54B, a second display pixel unit 86B may include the third display pixel 54C and the fourth display pixel 54D, and so on. However, it should be appreciated that the depicted example is merely intended to be illustrative and not limiting. For example, in other embodiments, a display pixel unit 86 may include three display pixels 54 or more than three (e.g., four) display pixels 54.

Returning to the process 72 of FIG. 8, to facilitate implementing the low resolution panel section 60 of the display panel 40, the design device may determine a target low resolution pixel layout that achieves its lower target pixel resolution. As described above, in some embodiments, a pixel layout of a low resolution panel section 60 of a display panel 40 may be determined based at least in part on the pixel layout of a corresponding high resolution panel section 62. For example, when the target pixel resolution of the low resolution panel section 60 is half the pixel resolution of the high resolution panel section 62, the design device may determine the target pixel layout for the low resolution panel section 60 by removing half of the display pixels 54 from the pixel layout of the high resolution panel section 62.

Figure 10:
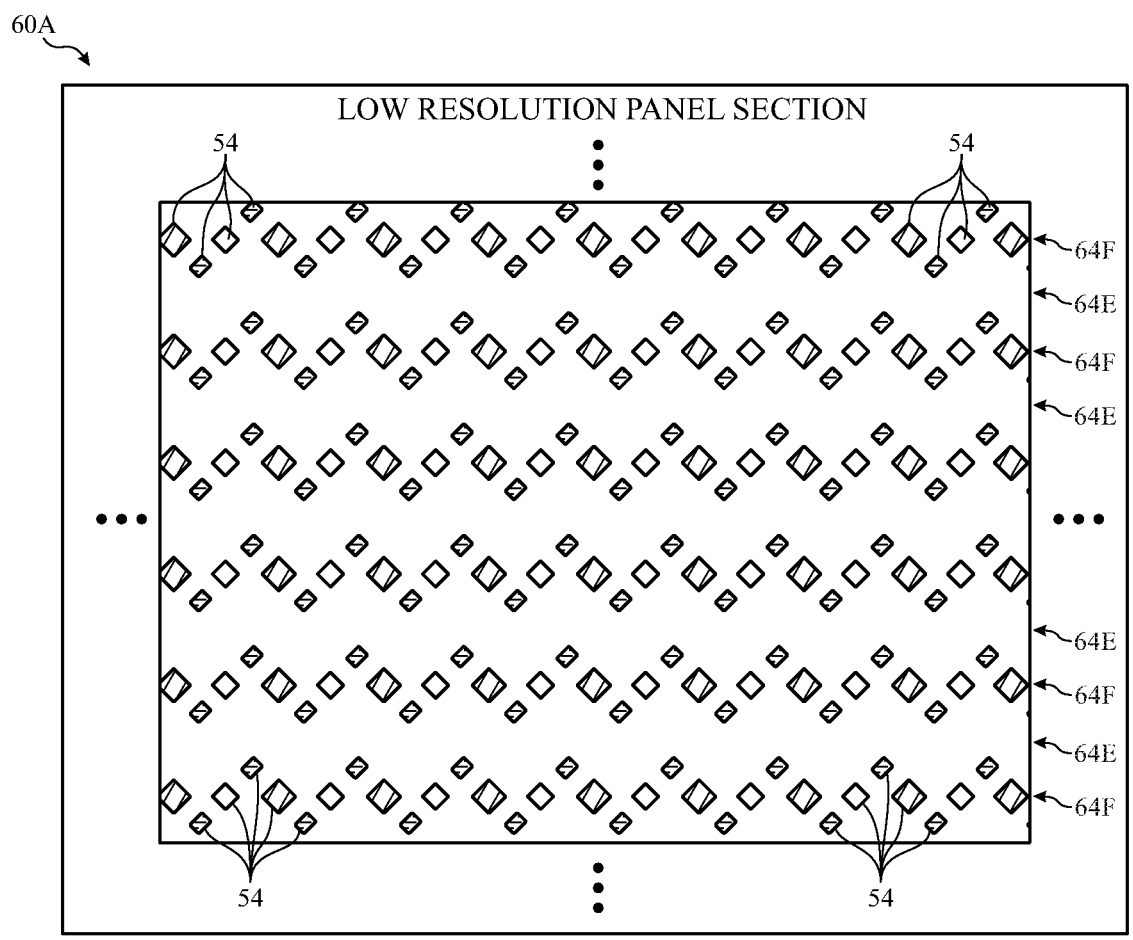
FIG. 10 is an example of a low resolution panel section implemented in the portion of the electronic display of FIG. 7, in accordance with an embodiment of the present disclosure.

To help illustrate, an example pixel layout of a low resolution panel section 60A is shown in FIG. 10. As depicted, relative to the high resolution panel section 62A of FIG. 9, every other line 64 of display pixels 54 is removed (e.g., not implemented) from the pixel layout of the low resolution panel section 60A. In other words, as depicted, the pixel layout of the low resolution panel section 60A alternates between full lines 64F of display pixels 54 and empty (e.g., removed) lines 64E of display pixels. As such, the low resolution panel section 60A of FIG. 10 may provide approximately half the pixel resolution of the high resolution panel section 62A of FIG. 9. However, as described above, the same pixel resolution may be implemented using multiple different pixel layouts.

Figure 11:
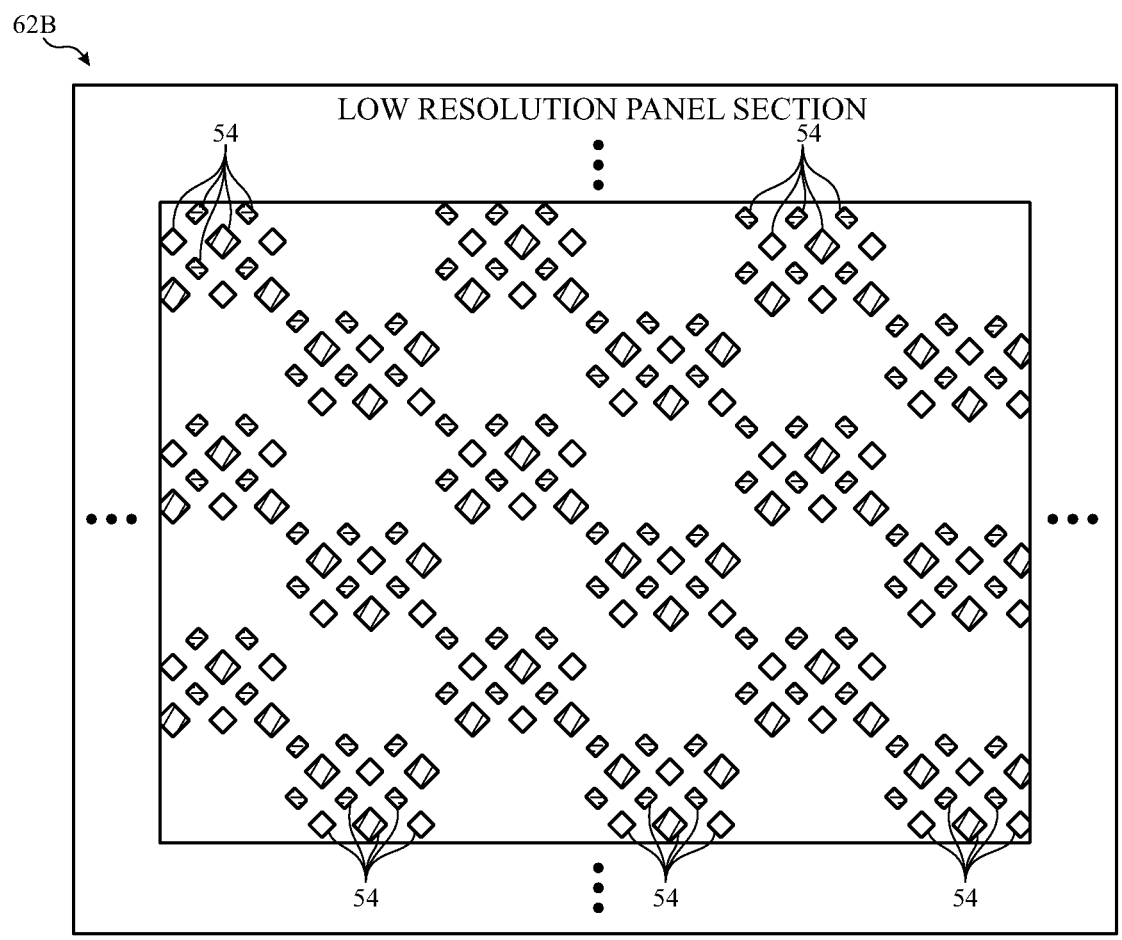
FIG. 11 is another example of a low resolution panel section implemented in the portion of the electronic display of FIG. 7, in accordance with an embodiment of the present disclosure.
Figure 12:
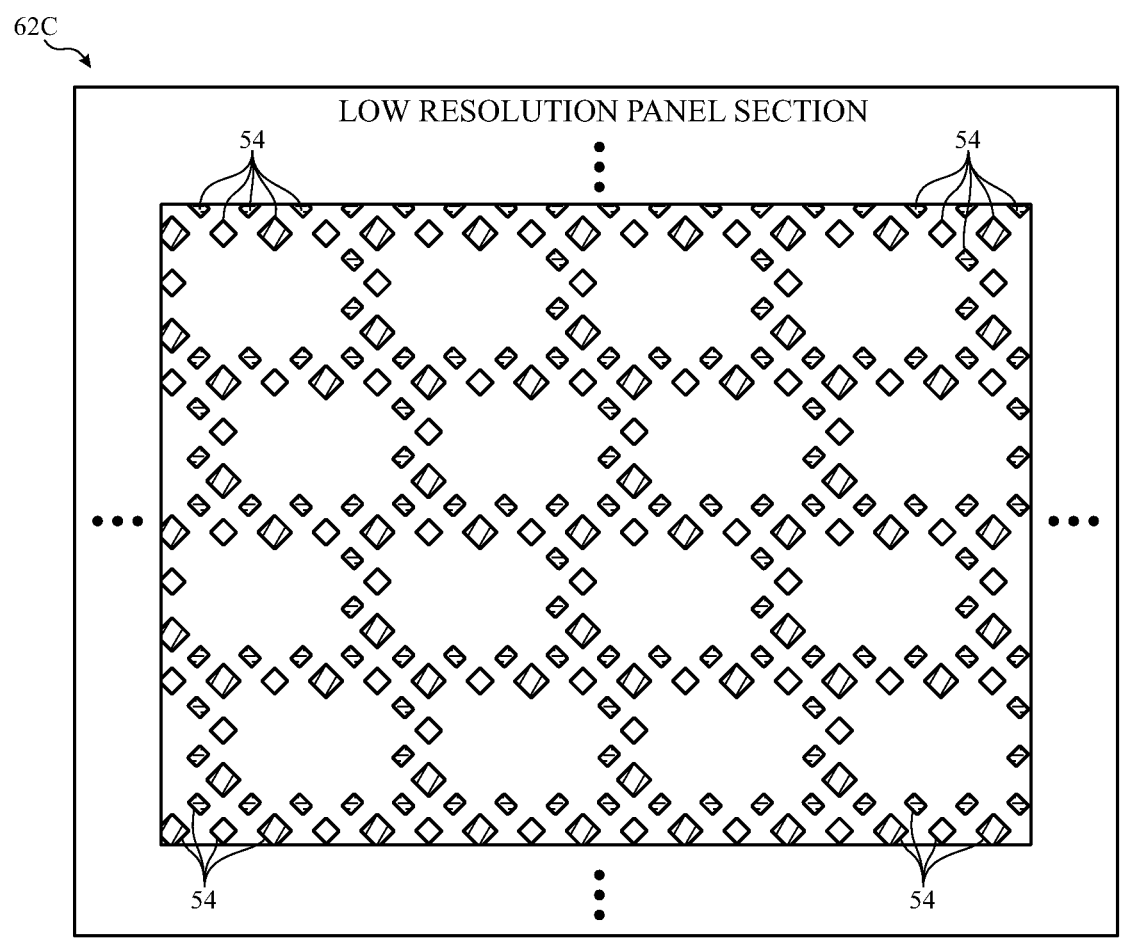
FIG. 12 is another example of a low resolution panel section implemented in the portion of the electronic display of FIG. 7, in accordance with an embodiment of the present disclosure.

To help illustrate, another example pixel layout of a low resolution panel section 60B, which provides approximately half the pixel resolution of the high resolution panel section 62A of FIG. 9, is shown in FIG. 11. Additionally, another example a low resolution panel section 60C, which provides approximately half the pixel resolution of the high resolution panel section 62A of FIG. 9, is shown in FIG. 12. Furthermore, another example a low resolution panel section 60D, which provides approximately half the pixel resolution of the high resolution panel section 62A of FIG. 9, is shown in FIG. 13.

Figure 13:
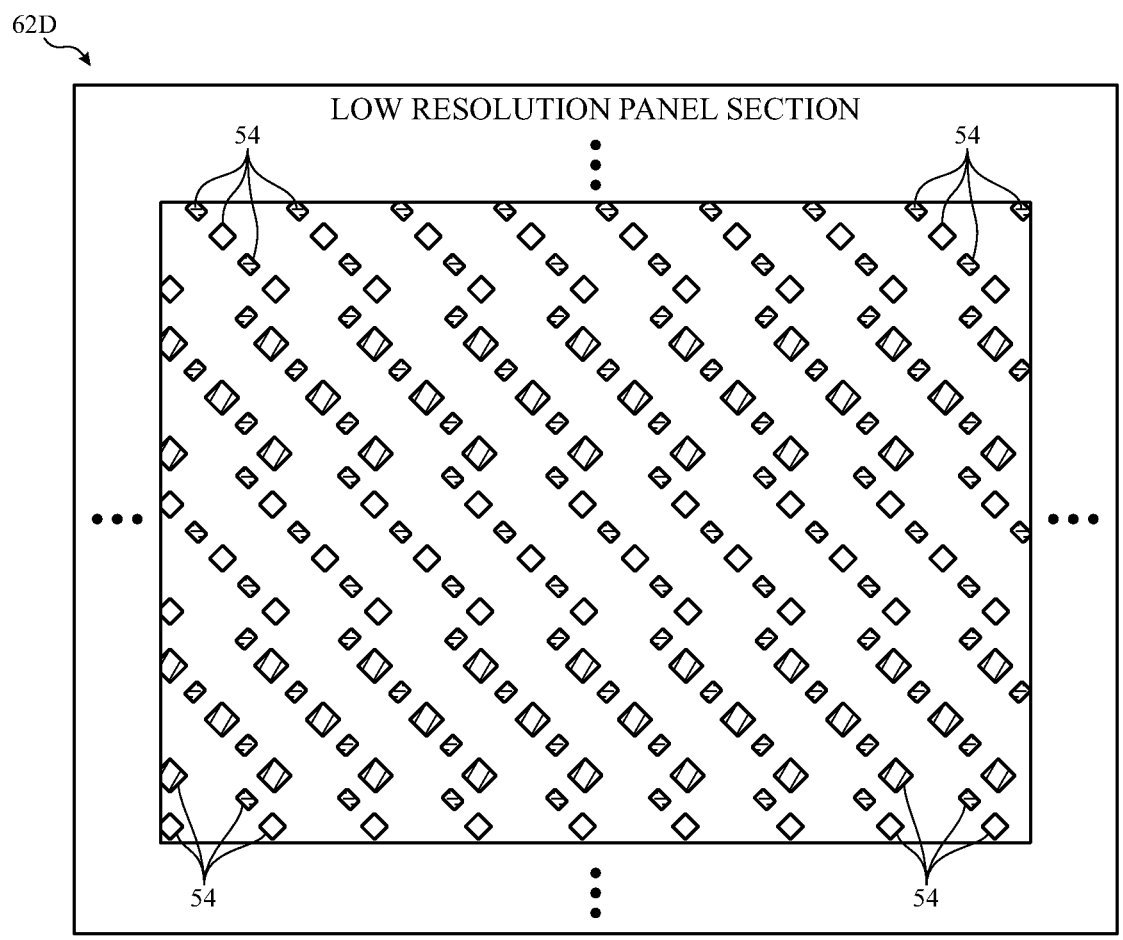
FIG. 13 is another example of a low resolution panel section implemented in the portion of the electronic display of FIG. 7, in accordance with an embodiment of the present disclosure.

Thus, when the target lower pixel resolution is half the pixel resolution of the high resolution panel section 62, the candidate pixel layouts for the low resolution panel section 60 may include the pixel layout of FIG. 10, the pixel layout of FIG. 11, the pixel layout of FIG. 12, the pixel layout of FIG. 13, or any combination thereof. As described above, even when implemented to provide the same pixel resolution, at least some instances, perceived image quality and/or light transmissiveness provided by different pixel layouts may nevertheless differ. As such, to facilitate improving perceived image quality provided by the display panel 40 and/or light sensing accuracy provided by an optical sensor 42A implemented behind the display panel 40, in some embodiments, the design device may select a target pixel layout to be used to implement the low resolution panel section 60 based at least in part on evaluation of an expected perceived image quality associated with each of the candidate pixel layouts (e.g., against a target perceived image quality) and/or an expected light transmissiveness associated with each of the candidate pixel layouts (e.g., against a target light transmissiveness).

In addition to a low resolution panel section 60 and a high resolution panel section 62, as described above, in some embodiments, a display panel 40 may include a resolution transition panel section. Thus, returning to the process 72 of FIG. 8, in such embodiments, implementing the display panel 40 may additionally include implementing a resolution transition panel section (process block 88). As described above, the resolution transition panel section may be implemented to facilitate reducing perceivability of transition between the low resolution panel section 60 and the high resolution panel section 62, for example, by gradually transitioning between the lower pixel resolution of the low resolution panel section 60 and the higher pixel resolution of the high resolution panel section 62. As such, in some embodiments, the resolution transition panel section may be implemented between the low resolution panel section 60 and the high resolution panel section 62 of the display panel 40.

Figure 14:
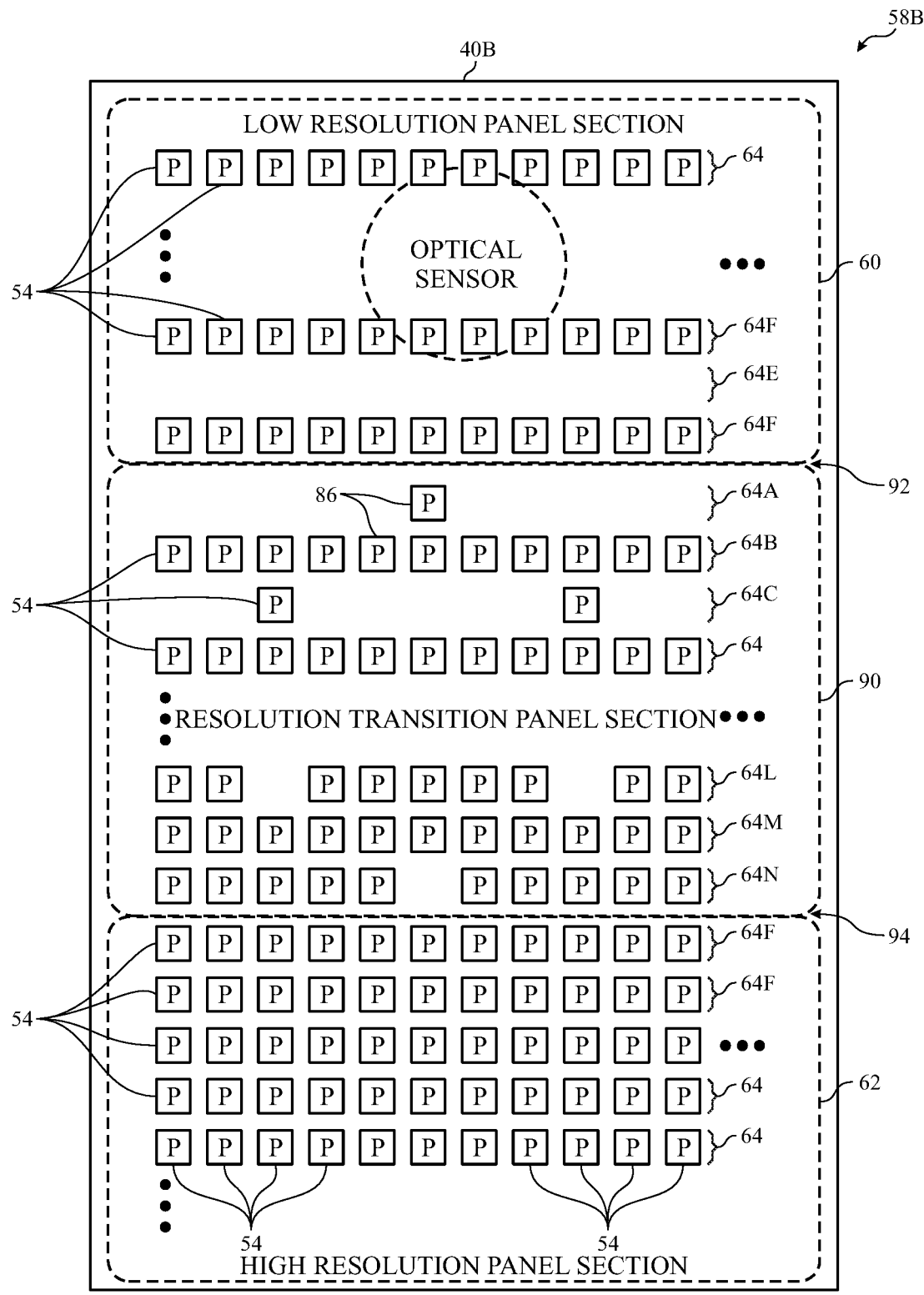
FIG. 14 is a diagrammatic representation of another example of a portion of the electronic display of FIG. 1 including the display panel of FIG. 6 implemented with multiple different resolution panel sections, in accordance with an embodiment of the present disclosure.

To help illustrate, another example of a portion 58B of an electronic device 10, which includes an optical sensor 42A and a display panel 40B implemented with a resolution transition panel section 90, is shown in FIG. 14. However, it should be appreciated that the depicted example is merely intended to illustrative and not limiting. For example, in other embodiments, the portion 58B of the electronic device 10 may include two or more optical sensors 42A.

Similar to the display panel 40A of FIG. 7, the display panel 40B of FIG. 14 includes a low resolution panel section 60 and a high resolution panel section 62. Additionally, as depicted, the optical sensor 42A may be implemented behind the low resolution panel section 60 of the display panel 40B. However, as depicted, the display panel 40B of FIG. 14 additionally includes a resolution transition panel section 90 implemented between its low resolution panel section 60 and its high resolution panel section 62

As described above, the resolution transition panel section 90 may be implemented to gradually transition between a lower pixel resolution of the low resolution panel section 60 and a higher pixel resolution of the high resolution panel section 62. Thus, as in the depicted example, the resolution transition panel section 90 may be implemented directly adjacent the low resolution panel section 60 and directly adjacent the high resolution panel section 62. In other words, as in the depicted example, a first line 64A of display pixels 54 in the resolution transition panel section 90 may be directly adjacent the low resolution panel section 60 and an Nth line 64N of display pixels 54 in the resolution transition panel section 90 may be directly adjacent the high resolution panel section 62.

To facilitate gradually transitioning between the lower pixel resolution and the higher pixel resolution, in some embodiments, a pixel layout of the resolution transition panel section 90 may be determined based at least in part on the pixel layout of the low resolution panel section 60 and/or the pixel layout of the high resolution panel section 62. As described above with regard to FIG. 7, the pixel layout of the low resolution panel section 60 may remove every other line 64 of display pixels 54 from the pixel layout of the high resolution panel section 62. In other words, the remaining lines 64 of display pixels 54 in the pixel layout of the low resolution panel section 60 may each be a full line 64 of display pixels 54 and the removed lines 64 of display pixels 54 may each include zero display pixels 54.

Thus, to facilitate reducing perceivability of the transition between the lower pixel resolution and the higher pixel resolution, as in the depicted example, every other line 64 of display pixels 54 in the resolution transition panel section 90 may each be a full line 64 of display pixels 54 while the remaining lines 64 of display pixels 54 each includes one or more display pixels 54, but is not a full line 64 of display pixels 54. In other words, a first set of lines 64 (e.g., even numbered lines 64) in the resolution transition panel section 90 may each be a full line 64 of display pixels while a second set of lines 64 (e.g., odd numbered lines 64) in the resolution transition panel section 90 may each be a less than full line 64 of display pixels 54.

In particular, as in the depicted example, the first line 64A in the resolution transition panel section 90, which is directly adjacent (e.g., below) the low resolution panel section 60, may almost be an empty line 64 and a second line 64B of display pixels 54 in the resolution transition panel section 90, which is directly adjacent (e.g., below) the first line 64A, may be a full line 64 of display pixels. In fact, of the lines 64 in the resolution transition panel section 90, in some embodiments, the first line 64A in the resolution transition panel section 90 may include the fewest number of display pixels 54. In this manner, the resolution transition panel section 90 may gradually transition from the lower pixel resolution of the low resolution panel section 60, which, at least in some instances, may facilitate reducing perceivability of a boundary 92 therebetween and, thus, improving perceived image quality provided by the display panel 40B.

Additionally, as in the depicted example, the Nth line 64N in the resolution transition panel section 90, which is directly adjacent (e.g., above) the high resolution panel section 62, may almost be a full line 64 of display pixels 54 and an N−1th line 64M in the resolution transition panel section 90, which is directly adjacent (e.g., above) the Nth line 64N of display pixels 54, may be a full line 64 of display pixels 54. In fact, of the less than full lines 64 in the resolution transition panel section, in some embodiments, the Nth line 64N may include the largest number of display pixels 54. In this manner, the resolution transition panel section 90 may gradually transition from the higher pixel resolution of the high resolution panel section 62, which, at least in some instances, may facilitate reducing perceivability of a boundary 94 therebetween and, thus, improving perceived image quality provided by the display panel 40B.

Furthermore, as in the depicted example, a third line 64C of display pixels 54 in the resolution transition panel section 90, which is directly adjacent (e.g., below) the second line 64B of display pixels 54, may be a less than full line 64 that includes more display pixels 54 than the first line 64A in the resolution transition panel section 90. For example, the first line 64A in the resolution transition panel section 90 may include a single display pixel 54 while the third line 64C in the resolution transition panel section 90 includes two display pixels 54. Moreover, as in the depicted example, an N−2th line 64L of display pixels 54 in the resolution transition panel section 90, which is directly adjacent (e.g., above) the N−1th line 64M of display pixels 54, may include fewer display pixels 54 than the Nth line 64N in the resolution transition panel section 90. For example, the Nth line 64N in the resolution transition panel section 90 may include one display pixel 54 less than a full line 64 of display pixels 54 while the N−2th line 64L includes two display pixel 54 less than a full line 64 of display pixels 54. In this manner, the resolution transition panel section 90 may facilitate gradually transitioning between the higher pixel resolution of the high resolution panel section 62 and the lower pixel resolution of the low resolution panel section 60, which, at least in some instances, may facilitate reducing perceivability of pixel resolution transitions and, thus, improving perceived image quality provided by the display panel 40B.

However, it should be appreciated that the depicted example is merely intended to illustrative and not limiting. In particular, in other embodiments, a resolution transition panel section 90 may be implemented with a different pixel layout to gradually transition between a lower pixel resolution and a higher pixel resolution. Additionally or alternatively, display pixels 54 may be removed from every other line 64 in the resolution transition panel section 90 at a faster rate per line 64 or a slower rate per line 64.

Returning to the process 72 of FIG. 8, to facilitate optimizing device real estate, one or more optical sensors 42A may be disposed behind the display panel 40 (process block 76). In particular, to facilitate improving light sensing accuracy, the one or more optical sensors 42A may be disposed behind a low resolution panel section 60 of the display panel 40. In this manner, an electronic device 10 may be implemented such that its display panel 40 and one or more of its optical sensors 42A share the same portion of an external surface, which, at least in some instances, may facilitate optimizing (e.g., maximizing) real estate available in the electronic device 10.

As described above, a display panel 40 may display an image by controlling light emission and, thus, perceived luminance of its display pixels 54. Additionally, as described above, image data corresponding with an image may indicate target color and/or target luminance at various points (e.g., image pixels) in the image. Accordingly, as described above, an image pixel in an image may correspond with a display pixel 54 and, thus, indicate the target luminance of the display pixel 54 for displaying (e.g., reproducing) a corresponding image. Furthermore, as described above, in some embodiments, image processing circuitry 27 may process image data before resulting image data is used to display a corresponding image on the display panel 40, for example, to facilitate compensating for varying pixel resolution to improve perceived image quality provided by the display panel 40.

Figure 15:
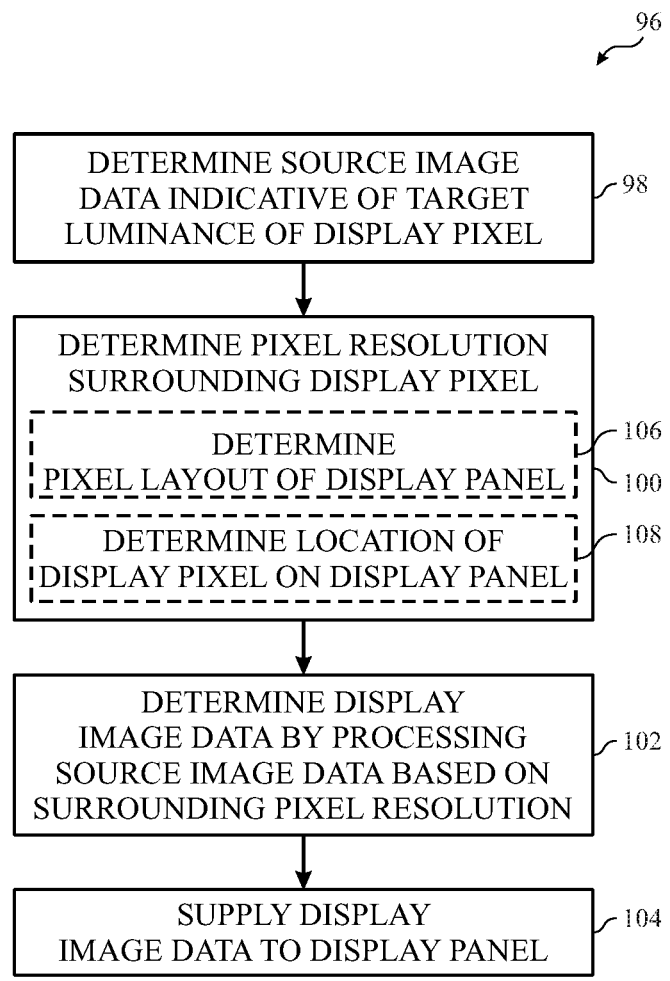
FIG. 15 is a flow diagram of an example process for operating the image processing circuitry of FIG. 6, in accordance with an embodiment of the present disclosure.

To help illustrate, an example of a process for operating image processing circuitry 27 implemented in an electronic device 10 is described in FIG. 15. Generally, the process 96 includes determining source image data indicative of target luminance of a display pixel (process block 98) and determining pixel resolution surrounding the display pixel (process block 100). Additionally, the process 96 includes determining display image data by processing the source image data based on the surrounding pixel resolution (process block 102) and supplying the display image data to a display panel (process block 104).

Although described in a particular order, which represents a particular embodiment, it should be noted that the process 96 may be performed in any suitable order. Additionally, embodiments of the process 96 may omit process blocks and/or include additional process blocks. Moreover, in some embodiments, the process 96 may be implemented at least in part by circuit connections formed (e.g., programmed) in image processing circuitry 27. Additionally or alternatively, the process 96 may be implemented at least in part by executing instructions stored in a tangible, non-transitory, computer-readable medium, such as controller memory 48, using processing circuitry, such as the controller processor 46.

Accordingly, in some embodiments, a controller 44 may instruct image processing circuitry 27 implemented in an electronic device 10 to determine source image data that is indicative of target luminance of a display pixel 54 (process block 98). As described above, source image data may be generated and/or output by an image source 38, such as a processor core complex 18, a graphics processing unit (GPU), an image sensor (e.g., camera), and/or the like. In some embodiments, the image processing circuitry 27 may receive the source image data directly from the image source 38. In other embodiments, the image source 38 may output the source image data for storage in a tangible, non-transitory, computer-readable medium, such as main memory 20. Thus, in such embodiments, the image processing circuitry 27 may receive (e.g., retrieve) the source image data from the tangible, non-transitory, computer-readable medium, for example, via a direct memory access (DMA) technique.

Additionally, the controller 44 and/or the image processing circuitry 27 may determine a pixel resolution surrounding the display pixel 54, which corresponds with the source image data (process block 100). In other words, the controller 44 and/or the image processing circuitry 27 may determine a pixel resolution implemented in an area of a display panel 40 that includes (e.g., surrounds) the display pixel 54. As described above, a pixel layout of a display panel 40 may indicate location and/or color component of its display pixels 54.

Thus, to facilitate determining the surrounding pixel resolution, in some embodiments, the controller 44 and/or the image processing circuitry 27 may determine a pixel layout of the display panel 40 (process block 106). In some embodiments, the controller 44 and/or the image processing circuitry 27 may determine the pixel layout of the display panel 40 as a whole. Additionally or alternatively, the controller 44 and/or the image processing circuitry 27 may determine the pixel layout of each panel section implemented in the display panel 40. Furthermore, in some embodiments, the pixel layout of the display panel 40 may be predetermined and stored in a tangible, non-transitory, computer-readable medium, such as main memory 20, implemented in an electronic device 10, for example, by a design device. Thus, in such embodiments, the controller 44 and/or the image processing circuitry 27 may retrieve the pixel layout of the display panel 40 from the tangible, non-transitory, computer-readable medium.

Additionally, to facilitate determining the surrounding pixel resolution, in some embodiments, the controller 44 and/or the image processing circuitry 27 may determine the pixel location (e.g., position) of the display pixel 54 corresponding with the source image data on the display panel 40 (process block 108). In some embodiments, the image processing circuitry 27 may process source image data corresponding with an image in a raster order. Thus, in such embodiments, the controller 44 and/or the image processing circuitry 27 may identify the display pixel 54 corresponding with source image data based at least in part on its processing order relative to other source image data corresponding with the same image, for example, in view of the pixel layout used to implement the display panel 40.

Moreover, based at least in part on the pixel location of the display pixel 54 and the pixel layout of the display panel, in some embodiments, the controller 44 and/or the image processing circuitry 27 may determine a panel section in which the display pixel 54 is implemented. For example, when the pixel location of the display pixel 54 is in a low resolution panel section 60 of the display panel 40, the controller 44 and/or the image processing circuitry 27 may determine that the pixel resolution surrounding the display pixel 54 is the pixel resolution of the low resolution panel section 60. On the other hand, when the pixel location of the display pixel 54 is in a high resolution panel section 62 of the display panel 40, the controller 44 and/or the image processing circuitry 27 may determine that the pixel resolution surrounding the display pixel 54 is the pixel resolution of the high resolution panel section 62.

In other words, in some embodiments, pixel locations of display pixels 54 on a display panel 40 may each be mapped to a corresponding surrounding pixel resolution based at least in part on the pixel layout of the display panel 40. As described above, in some embodiments, the pixel layout of a display panel 40 may be predetermined. Thus, in some such embodiments, the mapping of pixel locations to surrounding pixel resolutions may be predetermined and stored in a tangible, non-transitory, computer-readable medium, such as main memory 20, implemented in an electronic device 12, for example, by a design device. Accordingly, in such embodiments, the controller 44 and/or the image processing circuitry 27 may retrieve an indication of pixel resolution surrounding a display pixel 54 from the tangible, non-transitory, computer-readable medium based at least in part on its pixel location.

The controller 44 may then instruct the image processing circuitry 27 to process the source image data based at least in part on the surrounding pixel resolution to determine (e.g., generate) display image data corresponding with the display pixel 54 (process block 102). As described above, in some embodiments, the display image data may facilitate compensating for perceivable luminance variations that may otherwise result from different pixel resolutions implemented on the display panel 40. Additionally, as described above, to facilitate generating display image data, the image processing circuitry 27 may include a resolution compensation block 56 (e.g., circuitry group) implemented and/or operated to process image data based at least in part on pixel resolution surrounding a corresponding display pixel 54.

Figure 16:
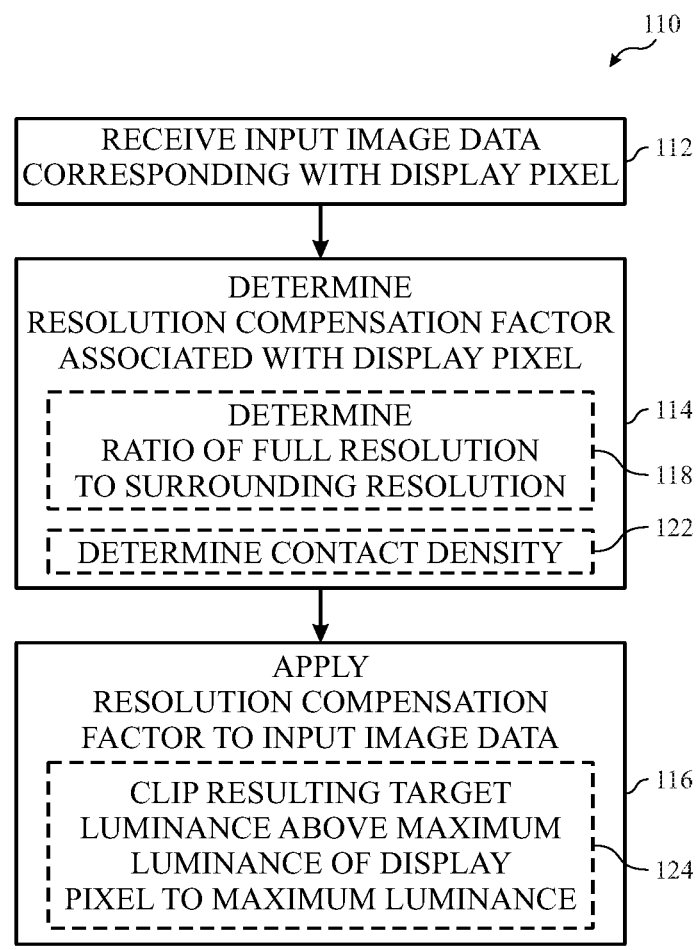
FIG. 16 is a flow diagram of an example process for processing image data corresponding with a display pixel implemented in a lower resolution panel section of the display panel of FIG. 6, in accordance with an embodiment of the present disclosure.

To help illustrate, an example of a process 110 for operating a resolution compensation block 56 (e.g., image processing circuitry 27) is described in FIG. 16. Generally, the process 110 includes receiving input image data corresponding with a display pixel (process block 112). Additionally, the process 110 includes determining a resolution compensation factor associated with the display pixel (process block 114) and applying the resolution compensation factor to the input image data (process block 116).

Although described in a particular order, which represents a particular embodiment, it should be noted that the process 110 may be performed in any suitable order. Additionally, embodiments of the process 110 may omit process blocks and/or include additional process blocks. Moreover, in some embodiments, the process 110 may be implemented at least in part by executing instructions stored in a tangible, non-transitory, computer-readable medium, such as controller memory 48, using processing circuitry, such as the controller processor 46. Additionally or alternatively, the process 110 may be performed based at least in part on circuit connections formed (e.g., programmed) in a resolution compensation block 56 implemented in image processing circuitry 27.

Accordingly, in some embodiments, a resolution compensation block 56 implemented in image processing circuitry 27 of an electronic device 10 may receive input image data corresponding with a display pixel 54 (process block 112). In some embodiments, the input image data may be source image data corresponding with the display pixel 54. In other embodiments, the input image data may be image data (e.g., processed image data) output from an upstream portion of the image processing circuitry 27.

Based at least in part on pixel resolution surrounding the display pixel 54, the resolution compensation block 56 may determine one or more resolution compensation factors to be applied to the input image data (process block 114). In some embodiments, the resolution compensation factors may include one or more offset values. Additionally or alternatively, the resolution compensation factors may include one or more gain values.

Furthermore, in some embodiments, the value of the one or more resolution compensation factors to be associated with a pixel resolution may be determined empirically, for example, by a design device during an offline calibration process. In other words, in some embodiments, the value of the one or more resolution compensation factors may be predetermined and stored in a tangible, non-transitory, computer-readable medium, such as main memory 20, implemented in an electronic device 12, for example, by the design device. Accordingly, in such embodiments, the image processing circuitry 27 may retrieve one or more resolution compensation factors associated with the pixel resolution surrounding the display pixel 54 from the tangible, non-transitory, computer-readable medium based at least in part on its pixel location.

As described above, perceived luminance of an area of a display panel 40 may vary with pixel resolution implemented therein. For example, when each display pixel 54 emits the same amount of light, doubling the pixel resolution may approximately double the perceived luminance. Conversely, halving the pixel resolution may approximately halve the perceived luminance.

As such, in some embodiments, the value of a (e.g., gain) resolution compensation factor to be applied to image data corresponding with a display pixel 54 may be determined based at least in part on a ratio of a full (e.g., high) pixel resolution implemented on the display panel 40 to the pixel resolution surrounding the display pixel 54, for example, by the design device during the offline calibration process (process block 118). Merely as an illustrative non-limiting example, when a display pixel 54 is implemented in a high resolution panel section 62 of the display panel 40, a gain resolution compensation factor to be applied to input image data corresponding with the display pixel 54 may be a unity gain value. Additionally, when the pixel resolution surrounding the display pixel 54 is half the full pixel resolution, a gain resolution compensation factor to be applied to input image data corresponding with the display pixel 54 may be approximately twice the unity gain value. Furthermore, when the pixel resolution surrounding the display pixel 54 is a quarter of the full pixel resolution, a gain resolution compensation factor to be applied to input image data corresponding with the display pixel 54 may be approximately four times the unity gain value.

Figure 17:
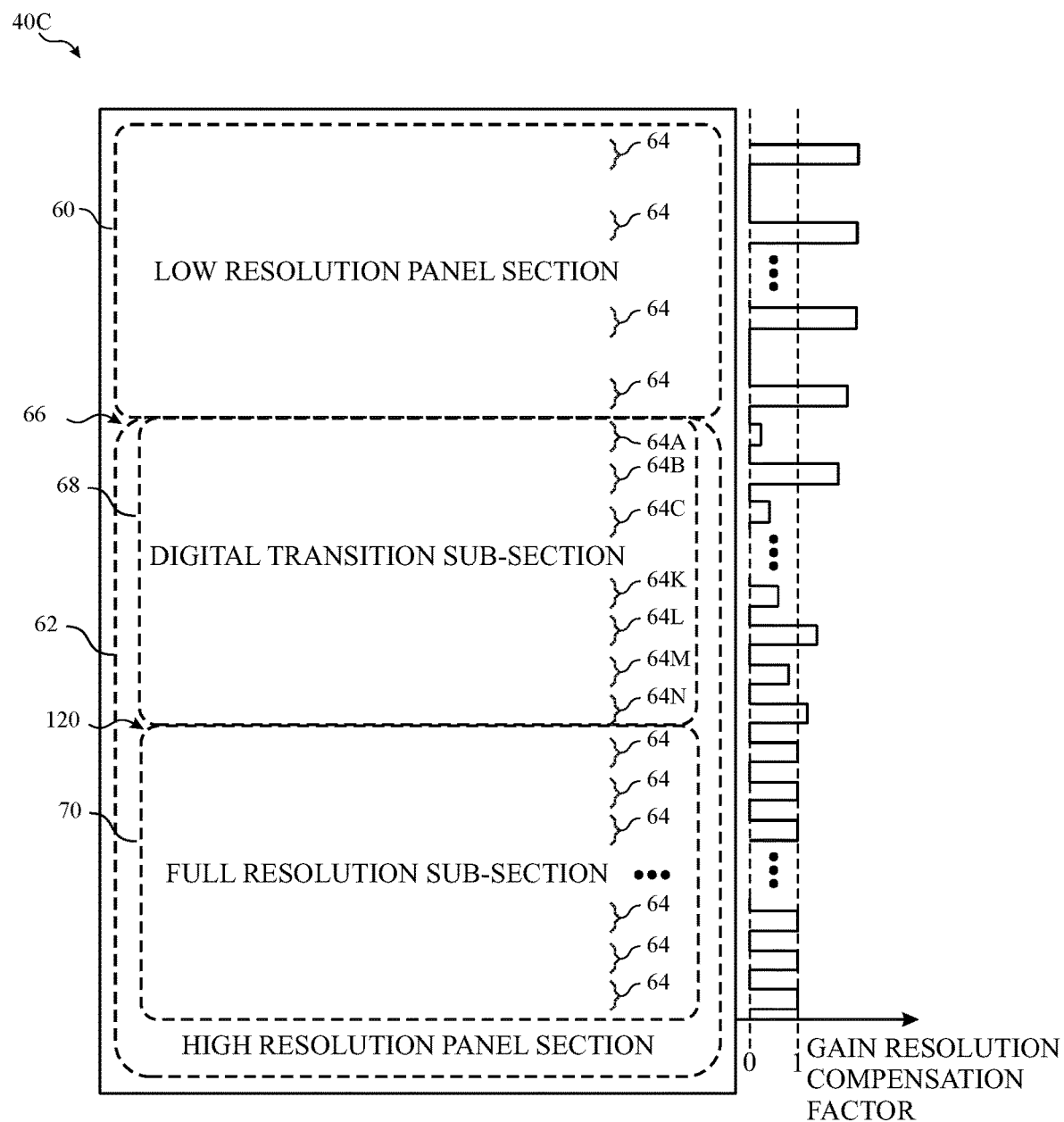
FIG. 17 is a diagrammatic representation of resolution compensation factors applied to image data supplied to the display panel of FIG. 6, in accordance with an embodiment of the present disclosure.

To help further illustrate, an example of gain resolution compensation factors associated with lines 64 of a display panel 40C is shown in FIG. 17. As depicted, the display panel 40C includes a low resolution panel section 60 and a high resolution panel section 62. Additionally, as depicted, the high resolution panel section 62 includes a portion operated as a digital transition sub-section 68 and another (e.g., different and/or remaining) portion operated as a full resolution sub-section 70.

Furthermore, as depicted, each gain resolution compensation factor associated with a line 64 of display pixels 54 in the full resolution sub-section 70 is a unity gain value. On the other hand, each gain resolution compensation factor associated with a line 64 of display pixels 54 in the low resolution panel section 60 is greater than the unity gain value. For example, when the pixel resolution of the low resolution panel section 60 is half the full pixel resolution of the high resolution panel section 62, each gain resolution compensation factor associated with a line 64 of display pixels 54 in the low resolution panel section 60 may be approximately twice the unity gain value.

To facilitate reducing perceivability of a boundary 66 between the low resolution panel section 60 and the high resolution panel section 62, as in the depicted example, gain resolution compensation factors associated with different lines 64 of display pixels in the digital transition sub-section 68 may vary. In particular, as depicted, a gain resolution compensation factor associated with a first line 64A in the digital transition sub-section 68, which is adjacent the low resolution panel section 60, is greater than a zero gain value and less than a unity gain value. Additionally, as depicted, a gain resolution compensation factor associated with a second line 64B in the digital transition sub-section 68, which is adjacent (e.g., below) the first line 64A, is greater than a unity gain value and less the gain resolution compensation factors associated with lines 64 in the low resolution panel section 60. Furthermore, as depicted, a gain resolution compensation factor associated with a third line 64C in the digital transition sub-section 68, which is adjacent (e.g., below) the second line 64B, is greater than a zero gain value and less than a unity gain value.

In particular, as depicted, the gain resolution compensation factor associated with the third line 64C in the digital transition sub-section 68 is greater than the gain resolution compensation factor associated with the first line 64A in the digital transition sub-section 68. As described above, in some embodiments, the actual pixel resolution implemented in the digital transition sub-section 68 may be the full pixel resolution of the high resolution panel section 62. However, by applying gain resolution compensation factors implemented in this manner, the digital transition sub-section 68 may be operated to produce a perceived pixel resolution that gradually transitions from the lower pixel resolution of the low resolution panel section 60, which, at least in some instances, may facilitate reducing perceivability of the boundary 66 therebetween and, thus, improving perceived image quality provided by the display panel 40C.

Moreover, as depicted, a gain resolution compensation factor associated with an Nth line 64N in the digital transition sub-section 68, which is adjacent (e.g., above) the full resolution sub-section 70, is greater than the gain resolution compensation factor associated with lines 64 in the full resolution sub-section 70. Additionally, as depicted, a gain resolution compensation factor associated with an N−1th line 64M in the digital transition sub-section 68, which is adjacent (e.g., above) the Nth line 64N, is greater than a zero gain value and less the gain resolution compensation factors associated with lines 64 in the full resolution sub-section 70. Furthermore, as depicted, a gain resolution compensation factor associated with a N−3th line 64L in the digital transition sub-section 68, which is adjacent (e.g., below) the second line 64B, is greater than the gain resolution compensation factor associated with lines 64 in the full resolution sub-section 70.

In particular, as depicted, the gain resolution compensation factor associated with the N−3th line 64L in the digital transition sub-section 68 is greater than the gain resolution compensation factor associated with the Nth line 64N in the digital transition sub-section 68. As described above, in some embodiments, the actual pixel resolution implemented in the digital transition sub-section 68 may be the full pixel resolution of the high resolution panel section 62. However, by applying gain resolution compensation factors implemented in this manner, the digital transition sub-section 68 may be operated to produce a perceived pixel resolution that gradually transitions from the higher pixel resolution of the full resolution sub-section 70, which, at least in some instances, may facilitate reducing perceivability of a boundary 120 therebetween and, thus, improving perceived image quality provided by the display panel 40C.

Moreover, as depicted, a gain resolution compensation factor associated with an N−4th line 64K in the digital transition sub-section 68 is less than the gain resolution compensation factor associated with the N−2th line 64M in the digital transition sub-section 68 and greater than the gain resolution compensation factor associated with the third line 64C in the digital transition sub-section 68, which is greater than the resolution compensation factor associated with the first line 64A in the digital transition sub-section 68. Thus, moving from the low resolution panel section 60 toward the full resolution sub-section 70, in some embodiments, the gain resolution compensation factors associated with every other line 64 of display pixels 54 in the digital transition sub-section 68 may gradually increase. In other words, moving from the full resolution sub-section 70 toward the low resolution panel section 60, in such embodiments, the gain resolution compensation factors associated with every other line 64 of display pixels 54 in the digital transition sub-section 68 may gradually decrease.

Additionally, as depicted, the gain resolution compensation factor associated with the second line 64B in the digital transition sub-section 68 is greater than the gain resolution compensation factor associated with the N−3th line 64L in the digital transition sub-section 68, which is greater than the gain resolution compensation factor associated with the Nth line 64N in the digital transition sub-section 68. Thus, moving from the full resolution sub-section 70 toward the low resolution panel section 60, in some embodiments, the gain resolution compensation factors associated with every other line 64 of display pixels in the digital transition sub-section 68 may gradually decrease. In other words, moving from the low resolution panel section 60 toward the full resolution sub-section 70, in such embodiments, the gain resolution compensation factors associated with every other line 64 of display pixels in the digital transition sub-section 68 may gradually decrease. Although actually implemented with the full pixel resolution of the high resolution panel section 62, by applying gain resolution compensation factors implemented in this manner, the digital transition sub-section 68 may be operated to produce a perceived pixel resolution that gradually transitions between the lower pixel resolution of the low resolution panel section 60 and the higher pixel resolution of the full resolution sub-section 70, which, at least in some instances, may facilitate improving perceived image quality provided by the digital transition sub-section 68 and, thus, the display panel 40C.

However, to facilitate further improving perceived image quality, in some embodiments, the value of a (e.g., gain) resolution compensation factor, which is to be applied to input image data corresponding with a display pixel 54, may not exactly match the ratio of the full pixel resolution to the pixel resolution surrounding the display pixel 54, for example, due at least in part to non-idealities of electrically conductive material implemented in the display panel 40. In particular, in ideal situations, electrically conductive material, such as conductive traces, are generally assumed to exhibit zero resistance. However, in real word (e.g., non-ideal) applications, electrically conductive material generally exhibits non-zero resistance. In fact, resistance exhibited by electrically conductive material generally varies with its dimensions, for example, such that resistance increases as length of the electrically conductive material increases.

Moreover, at least in some instances, electrically conductive material may interact with other electrically conductive material, for example, due to parasitic capacitance resulting from an electric field produced by a change in voltage over time (e.g., dV/dt). However, magnitude of an electric field produced by electrically conductive material and, thus, the effect of resulting parasitic capacitance generally varies with distance. For example, increasing the distance from the electrically conductive material may reduce the magnitude of an experienced electric field and, thus, the effect of resulting parasitic capacitance.

In other words, at least in some instances, outputting the same analog electrical signal to write different display pixels 54 on a display panel 40 may result in differing amounts of electrical energy being stored therein and, thus, differing light emissions, for example, due to length of electrically conductive material coupled between a data driver 52 and the display pixels 54 differing. Additionally or alternatively, even when the same amount of electrical energy is stored therein, at least in some instances, magnitude of electrical current supplied from a pixel power (e.g., VDD) supply rail to light emissive elements (e.g., OLEDs) of different display pixels 54 and, thus, resulting light emission may nevertheless vary, for example, due to length of electrically conductive material coupled between the light emissive elements and contacts of the pixel power (e.g., VDD) supply rail differing. Thus, returning to the processes 110 of FIG. 16, in some embodiments, one or more resolution compensation factors to be applied to image data corresponding a display pixel 54 may be determined based at least in part on contact density implemented on the display panel 40.

To facilitate compensating for pixel resolution, the controller 44 may then instruct the resolution compensation block 56 to apply the one or more compensation factors to the input image data to determine (e.g., generate) output (e.g., processed and/or resolution compensated) image data (process block 116). For example, the resolution compensation block 56 may apply one or more offset resolution compensation factors to bias the image data. Additionally or alternatively, the resolution compensation block 56 may apply one or more gain resolution compensation factors to scale (e.g., boost) the image data.

At least in some instances, applying one or more resolution compensation factors to the input image may result in corresponding output image data indicating a target luminance greater than a default maximum display pixel luminance. Generally, a display panel 40 may operate using one of multiple different panel brightness settings, which each corresponds with a default pixel luminance range spanning from a minimum display pixel luminance to default maximum display pixel luminance. In some embodiments, a default maximum display pixel luminance associated with a panel brightness setting may be less than a maximum display pixel luminance of the display panel 40, for example, when the panel brightness setting is not a maximum brightness setting. Thus, in some embodiments, output image data indicating a target luminance greater than a default maximum display pixel luminance may nevertheless be permissible and, in fact, may facilitate further improving perceived image quality provided by the display panel 40, for example, by enabling the display panel 40 to display high-dynamic-range (HDR) image content in a low resolution panel section 60.

On the other hand, the maximum display pixel luminance of the display panel 40 is generally the upper limit of light emission from a display pixel 54. However, in at least some instances, applying one or more resolution compensation factors to the input image may also result in corresponding output image data indicating a target luminance greater than a maximum display pixel luminance of the display panel 40. Thus, in such instances, the resolution compensation block 56 may clip target luminance, which exceeds a maximum display pixel luminance of the display panel 40, to the maximum display pixel luminance. In this manner, a resolution compensation block 56 (e.g., image processing circuitry 27) may operate to facilitate generating display image data that compensates for pixel resolution.

Returning to the process 96 of FIG. 15, the controller 44 may then instruct the image processing circuitry 27 to supply the display image data to the display panel 40, thereby enabling the display panel 40 to display a corresponding image based at least in part on the display image data (process block 104). As described above, the image processing circuitry 27 may generate the display image data to compensate for varying pixel resolutions on the display panel 40. As such, at least in some instances, displaying the image based on the display image data may facilitate reducing perceivability of luminance variation resulting from the varying pixel resolutions and, thus, improving perceived image quality provided by the display panel 40, for example, compared to displaying the image directly using the source image data.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. An electronic device comprising:
a display panel comprising a first panel section implemented with a lower pixel resolution and a second panel section implemented with a higher pixel resolution, wherein the second panel section has a first portion directly adjacent the first panel section, wherein the first portion of the second panel section comprises:
a first line of display pixels;
a second line of display pixels directly adjacent the first line of display pixels; and
a third line of display pixels directly adjacent the second line of display pixels; and
image processing circuitry communicatively coupled to the display panel, wherein the image processing circuitry is configured to adjust image data corresponding with display pixels of the first portion of the second panel section at least in part by:
applying a first gain value greater than a unity gain value to image data corresponding with display pixels in the first line of display pixels;
applying a second gain value less than the unity gain value to image data corresponding with display pixels in the second line of display pixels; and
applying a third gain value greater than the first gain value to image data corresponding with display pixels in the third line of display pixels.

2. The electronic device of claim 1, wherein the display panel comprises a third panel section implemented with a pixel resolution greater than the lower pixel resolution of the first panel section and less than the higher pixel resolution of the second panel section.

3. The electronic device of claim 2, wherein the third panel section comprises:
a fourth line of display pixels directly adjacent the first panel section implemented with the lower pixel resolution, wherein the fourth line of display pixels comprises a first number of display pixels corresponding to less than a full line of pixels of the higher resolution panel section and less than a full line of pixels of the lower resolution panel section; and
a fifth line of display pixels directly adjacent the second panel section implemented with the higher pixel resolution, wherein the fifth line of display pixels comprises a second number of display pixels greater than the first number of display pixels and less than a full line of display pixels of the higher resolution panel section and less than a full line of pixels of the lower resolution panel section.

4. The electronic device of claim 3, wherein:
the first panel section implemented with the lower pixel resolution comprises:
a first full line of display pixels directly adjacent the fourth line of display pixels in the third panel section; and
a second full line of display pixels separated from the first full line of display pixels in the first panel section by a space equivalent to a removed line of display pixels;
the second panel section implemented with the higher pixel resolution comprises:
a third full line of display pixels directly adjacent the fifth line of display pixels in the third panel section; and
a fourth full line of display pixels directly adjacent the third full line of display pixels in the second panel section; and
the third panel section comprises a fifth full line of display pixels implemented between the fourth line of display pixels in the third panel section and the fifth line of display pixels in the third panel section.

5. The electronic device of claim 1, wherein the first panel section implemented with the lower pixel resolution is directly adjacent a higher resolution panel section of the display panel and comprises:
a first full line of display pixels directly adjacent the higher resolution panel section; and a second full line of display pixels separated from the first full line of display pixels in the first panel section by a removed line of display pixels.

6. The electronic device of claim 1, comprising an optical sensor disposed behind the first panel section of the display panel configured to accurately sense light that passes through an external surface of the electronic device as well as light transmissive material implemented in the display panel, wherein the optical sensor comprises an ambient light sensor configured to sense environmental lighting conditions.

7. The electronic device of claim 1, comprising an optical sensor disposed behind the first panel section of the display panel configured to sense light that passes through an external surface of the electronic device as well as light transmissive material implemented in the display panel, wherein the optical sensor comprises an image sensor configured to generate image data based at least in part on sensed light.

8. The electronic device of claim 1, wherein the lower pixel resolution of the first panel section is a fraction of the higher pixel resolution of the second panel section.

9. The electronic device of claim 1, wherein
the first portion of the second panel section comprises:
a fourth line of display pixels directly adjacent the first line of display pixels in the first portion of the second panel section; and
a fifth line of display pixels directly adjacent the fourth line of display pixels in the first portion of the second panel section; and
the image processing circuitry is configured to adjust image data corresponding with display pixels of the first portion of the second panel section at least in part by:
applying a third gain value greater than the unity gain value and less than the first gain value to image data corresponding with display pixels included in the fourth line of display pixels; and
applying a fourth gain value less than the unity gain value and greater than the second gain value to image data corresponding with display pixels included in the fifth line of display pixels.

10. The electronic device of claim 1, wherein the image processing circuitry is configured to:
determine a pixel location of the display pixel corresponding with source image data corresponding with the image on the display panel; and
determine the pixel resolution surrounding the display pixel based at least in part on the pixel location of the display pixel relative to a pixel layout of the display panel.

11. The electronic device of claim 1, wherein the image processing circuitry comprises resolution compensation circuitry configured to:
receive input image data corresponding with the display pixel;
determine one or more resolution compensation factors based at least in part on the pixel resolution surrounding the display pixel; and
output processed image data corresponding with the display pixel at least in part by applying the one or more resolution compensation factors to adjust a target luminance of the display pixel in the image.

12. The electronic device of claim 1, wherein the third line of display pixels of the first portion of the second panel section is directly adjacent to the first panel section.

13. The electronic device of claim 1, wherein the first line of display pixels of the first portion of the second panel section is directly adjacent to a fourth line of display pixels of the second panel section.

14. The electronic device of claim 1, wherein:
the first portion of the second panel section comprises:
a fourth line of display pixels directly adjacent the third line of display pixels; and
a fifth line of display pixels directly adjacent the fourth line of display pixels; and
the image processing circuitry is configured to adjust the image data corresponding with display pixels of the first portion of the second panel section at least in part by:
applying a fourth gain value less than the second gain value to image data corresponding with display pixels in the fourth line of display pixels; and
applying a fifth gain value greater than the third gain value to image data corresponding with display pixels in the fifth line of display pixels.

15. A method of operating an electronic device, comprising:
receiving, using image processing circuitry implemented in the electronic device, input image data corresponding with an image to be displayed on a display panel communicatively coupled to the image processing circuitry;
determining, using the image processing circuitry, a resolution compensation factor to be applied to the input image data, wherein:
the resolution compensation factor comprises a different gain value when a display pixel is implemented in a higher resolution panel section of the display panel than
when the display pixel is implemented in a lower resolution panel section of the display panel that is disposed over one or more optical sensors of the electronic device;
determining, using the image processing circuitry, display image data to be used to display the image on the display panel at least in part by applying the resolution compensation factor to the input image data, wherein the image processing circuitry is configured to apply the resolution compensation factor at least in part by:
applying a first gain value greater than a unity gain value to image data corresponding with display pixels in a first line of display pixels of the higher resolution panel section directly adjacent the lower resolution panel section;
applying a second gain value less than the unity gain value to image data corresponding with display pixels in a second line of display pixels of the higher resolution panel section directly adjacent the first line of display pixels; and
applying a third gain value greater than the unity gain value but less than the first gain value to image data corresponding with display pixels in a third line of display pixels of the higher resolution panel section directly adjacent the second line of display pixels; and
outputting, using the image processing circuitry, the display image data to enable the display panel to display the image at least in part by controlling light emission from the display pixel based at least in part on the display image data.

16. The method of claim 15, comprising:
determining, using the image processing circuitry, a pixel location of the display pixel on the display panel; and determining, using the image processing circuitry, whether the display pixel is implemented in the lower resolution panel section based at least in part on the pixel location of the display pixel relative to a pixel layout of the display panel, wherein determining the resolution compensation factor to be applied to the input image data comprises:
  selecting the first gain value as the resolution compensation factor to be applied to the input image data in response to determining that the display pixel is implemented in the lower resolution panel section.

17. The method of claim 15, wherein the first gain value of the resolution compensation factor is determined based at least in part on a ratio of a first pixel resolution of the higher resolution panel section to a second pixel resolution of the lower resolution panel section.

18. The method of claim 15, wherein the third line of display pixels of the higher resolution panel section is directly adjacent to the lower resolution panel section.

19. The method of claim 15, wherein the first line of display pixels of the higher resolution panel section is directly adjacent to a fourth line of display pixels of the lower resolution panel section.

20. The method of claim 15, wherein:
  the higher resolution panel section comprises:
    a fourth line of display pixels directly adjacent the third line of display pixels; and
    a fifth line of display pixels directly adjacent the fourth line of display pixels; and
  the method comprises:
    applying a fourth gain value less than the second gain value to image data corresponding with display pixels in the fourth line of display pixels; and
    applying a fifth gain value greater than the third gain value to image data corresponding with display pixels in the fifth line of display pixels.

21. An electronic display comprising a display panel configured to display an image frame, wherein the display panel comprises:
  a higher resolution panel section comprising a first plurality of display pixels configured to display a first portion of the image frame, wherein the first plurality of display pixels are implemented in the higher resolution panel section in accordance with a first pixel layout to provide a first pixel resolution;
  a lower resolution panel section comprising a second plurality of display pixels configured to display a second portion of the image frame, wherein the second plurality of display pixels are implemented in the lower resolution panel section in accordance with a second pixel layout different from the first pixel layout of the higher resolution panel section to provide a second pixel resolution that enables one or more optical sensors to be implemented behind the lower resolution panel section; and
  a resolution transition panel section implemented between the higher resolution panel section and the lower resolution panel section, wherein:
    the resolution transition panel section comprises a third plurality of display pixels configured to display a third portion of the image frame, wherein the third plurality of display pixels have an arrangement that includes;
      a first line of display pixels directly adjacent the lower resolution panel section, wherein the first line of display pixels comprises a first number of display pixels, wherein the first number of display pixels is less than a full line of display pixels;
      a second line of display pixels directly adjacent the first line of display pixels in the resolution transition panel section, wherein the second line of display pixels comprises a second number of display pixels, wherein the second number of display pixels corresponds to a full line of display pixels; and
      a third line of display pixels directly adjacent the second line of display pixels in the resolution transition panel section, wherein the second line of display pixels comprises a second number of display pixels greater than the first number of display pixels but less than a full line of display pixels.

22. The electronic display of claim 21, wherein the display panel is configured to:
  receive first display image data corresponding with the first plurality of display pixels in the higher resolution panel section from image processing circuitry that determines the first display image data by processing first source image data corresponding with the first plurality of display pixels based at least in part on the first pixel resolution of the higher resolution panel section;
  display the first portion of the image frame in the higher resolution panel section at least in part by supplying analog electrical signals to the first plurality of display pixels based at least in part on the first display image data received from the image processing circuitry;
  receive second display image data corresponding with the second plurality of display pixels in the lower resolution panel section from the image processing circuitry that determines the second display image data by processing second source image data corresponding with the second plurality of display pixels based at least in part on the second pixel resolution of the lower resolution panel section; and
  display the second portion of the image frame in the lower resolution panel section at least in part by supplying analog electrical signals to the second plurality of display pixels based at least in part on the second display image data received from the image processing circuitry.

23. The electronic display of claim 21, wherein the second pixel layout of the lower resolution panel section adapts the first pixel layout of the higher resolution panel section to remove every other line of display pixels.

24. The electronic display of claim 21, wherein the lower resolution panel section comprises:
  a first full line of display pixels; and
  a second full line of display pixel separated from the first full line of display pixels by an empty line of display pixels.

25. The electronic display of claim 21, wherein the second plurality of display pixels is implemented in the lower resolution panel section in accordance with the second pixel layout to enable an ambient light sensor, an image sensor, or both to be implemented behind the lower resolution panel section.

* * * * *

UNITED STATES PATENT AND TRADEMARK OFFICE
CERTIFICATE OF CORRECTION

PATENT NO. : 11,217,211 B2
APPLICATION NO. : 16/928859
DATED : January 4, 2022
INVENTOR(S) : Yingying Tang et al.

Page 1 of 1

It is certified that error appears in the above-identified patent and that said Letters Patent is hereby corrected as shown below:

In the Claims

Column 40, Claim 21, Line 13, replace the word "second" with --third--.

Column 40, Claim 21, Line 14, replace the word "second" with --third--.

Signed and Sealed this
Sixth Day of September, 2022

Katherine Kelly Vidal
*Director of the United States Patent and Trademark Office*